United States Patent
Tai et al.

(10) Patent No.: US 11,635,566 B2
(45) Date of Patent: Apr. 25, 2023

(54) PACKAGE AND METHOD OF FORMING SAME

(71) Applicant: Taiwan Semiconductor Manufacturing Co., Ltd., Hsinchu (TW)

(72) Inventors: Chih-Hsuan Tai, Taipei (TW); Chung-Ming Weng, Hsinchu (TW); Hung-Yi Kuo, Taipei (TW); Cheng-Chieh Hsieh, Tainan (TW); Hao-Yi Tsai, Hsinchu (TW); Chung-Shi Liu, Hsinchu (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 214 days.

(21) Appl. No.: 16/884,843

(22) Filed: May 27, 2020

(65) Prior Publication Data
US 2021/0157052 A1    May 27, 2021

Related U.S. Application Data

(60) Provisional application No. 62/941,229, filed on Nov. 27, 2019.

(51) Int. Cl.
*G02B 6/12* (2006.01)
*G02B 6/42* (2006.01)
(Continued)

(52) U.S. Cl.
CPC ........... *G02B 6/12004* (2013.01); *G02B 6/13* (2013.01); *G02B 6/4249* (2013.01); *G02B 6/43* (2013.01);
(Continued)

(58) Field of Classification Search
CPC .... G02B 6/12004; G02B 6/13; G02B 6/4249; G02B 6/43; G02B 2006/12147;
(Continued)

(56) References Cited

U.S. PATENT DOCUMENTS 6,935,792 B2    8/2005    Saia et al.
10,340,249 B1    7/2019    Yu et al.
(Continued)

FOREIGN PATENT DOCUMENTS

CN    1723405 A    1/2006
CN    102455472 A    5/2012
(Continued)

*Primary Examiner* — Kaveh C Kianni
*Assistant Examiner* — Hung Q Lam
(74) *Attorney, Agent, or Firm* — Slater Matsil, LLP

(57) ABSTRACT

An integrated circuit package and a method of forming the same are provided. The integrated circuit package includes a photonic integrated circuit die. The photonic integrated circuit die includes an optical coupler. The integrated circuit package further includes an encapsulant encapsulating the photonic integrated circuit die, a first redistribution structure over the photonic integrated circuit die and the encapsulant, and an opening extending through the first redistribution structure and exposing the optical coupler.

20 Claims, 44 Drawing Sheets

(51) Int. Cl.
*H01L 23/498* (2006.01)
*G02B 6/13* (2006.01)
*G02B 6/43* (2006.01)

(52) U.S. Cl.
CPC .. *H01L 23/49827* (2013.01); *H01L 23/49838* (2013.01); *G02B 2006/12147* (2013.01)

(58) Field of Classification Search
CPC . G02B 6/4257; G02B 6/428; H01L 23/49827; H01L 23/49838; H01L 23/5389; H01L 23/485; H01L 21/50; H01L 21/56; H01L 21/568; H01L 23/3157; H01L 24/02; H01L 25/167; H01L 2224/02379; H01L 23/50; H01L 23/31; H01L 23/481; H01L 23/525; H01L 25/0657
USPC .......................................................... 385/14
See application file for complete search history.

(56) References Cited

U.S. PATENT DOCUMENTS

| | | |
|---|---|---|
| 2009/0245724 A1 | 10/2009 | Koizumi et al. |
| 2012/0104454 A1 | 5/2012 | Coffy |
| 2018/0180808 A1 | 6/2018 | Zhang et al. |
| 2019/0004247 A1* | 1/2019 | Huang ................ G02B 6/4214 |
| 2019/0146166 A1 | 5/2019 | Wang et al. |
| 2019/0181172 A1 | 6/2019 | Kim et al. |
| 2019/0285804 A1 | 9/2019 | Ramachandran et al. |

FOREIGN PATENT DOCUMENTS

| | | |
|---|---|---|
| CN | 107564822 A | 1/2018 |
| JP | 2009229962 A | 10/2009 |
| KR | 20190003296 A | 1/2019 |
| TW | 201926584 A | 7/2019 |
| WO | 2019050477 A1 | 3/2019 |

* cited by examiner

PACKAGE AND METHOD OF FORMING SAME

PRIORITY CLAIM AND CROSS-REFERENCE

This application claims the benefit of U.S. Provisional Application No. 62/941,229, filed on Nov. 27, 2019, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
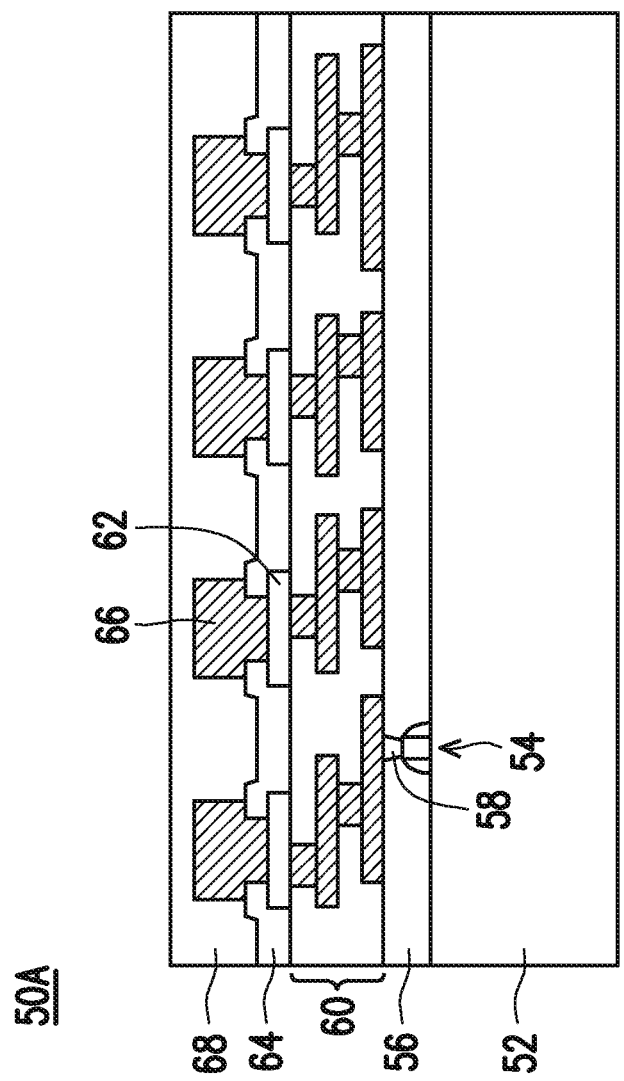
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely a package and a method of forming the same. Various embodiments presented herein describe formation of an integrated fan-out (InFO) package used in photonics applications. Various embodiments presented herein allow for a cost competitive photonics InFO package with bandwidth scalability and relaxed accuracy requirement for optical fiber assembly.

FIG. 1 illustrates a cross-sectional view of an integrated circuit die 50A in accordance with some embodiments. The integrated circuit die 50A will be packaged in subsequent processing to form an integrated circuit package. The integrated circuit die 50A may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50A may be formed in a wafer, which may include different device regions that are singulated in subsequent steps to form a plurality of integrated circuit dies. The integrated circuit die 50A may be processed according to applicable manufacturing processes to form integrated circuits. For example, the integrated circuit die 50A includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, inductors, the like, or combinations thereof. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, atomic layer deposition (ALD), chemical vapor deposition (CVD), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and the conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. In some embodiments, interconnect structure 60 may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). The metallization patterns of the interconnect structure 60 are electrically coupled to the devices 54 by the conductive plugs 58.

The integrated circuit die 50A further includes pads 62, such as aluminum pads, to which external connections are made. The pads 62 are on the active side of the integrated circuit die 50A, such as in and/or on the interconnect structure 60. One or more passivation layers 64 are on the integrated circuit die 50A, such as on portions of the interconnect structure 60 and the pads 62. Openings extend through the passivation layers 64 to the pads 62. Die connectors 66, such as conductive pillars (for example, formed of a metal such as copper), extend through the openings in the passivation layers 64 and are physically and electrically coupled to respective ones of the pads 62. The die connectors 66 may be formed by, for example, plating, or the like. The die connectors 66 are electrically coupled the respective integrated circuits of the integrated circuit die 50A.

Optionally, solder regions (e.g., solder balls or solder bumps) may be disposed on the die connectors 66. The solder balls may be used to perform chip probe (CP) testing on the integrated circuit die 50A. The CP testing may be performed on the integrated circuit die 50A to ascertain whether the integrated circuit die 50A is a known good die (KGD). Thus, only integrated circuit dies 50A, which are KGDs, undergo subsequent processing and are packaged, and dies, which fail the CP testing, are not packaged. After the CP testing, the solder regions may be removed in subsequent processing steps.

An insulating layer 68 may (or may not) be on the active side of the integrated circuit die 50A, such as on the passivation layers 64 and the die connectors 66. The insulating layer 68 laterally encapsulates the die connectors 66, and the insulating layer 68 is laterally coterminous with the integrated circuit die 50A. Initially, the insulating layer 68 may bury the die connectors 66, such that the topmost surface of the insulating layer 68 is above the topmost surfaces of the die connectors 66. In some embodiments where solder regions are disposed on the die connectors 66, the insulating layer 68 may bury the solder regions as well. Alternatively, the solder regions may be removed prior to forming the insulating layer 68.

The insulating layer 68 may be a polymer such as polybenzoxazole (PBO), polyimide, benzocyclobutene (BCB), or the like; a nitride such as silicon nitride or the like; an oxide such as silicon oxide, PSG, BSG, BPSG, or the like; the like, or a combination thereof. The insulating layer 68 may be formed, for example, by spin coating, lamination, ALD, CVD, or the like. In some embodiments, the die connectors 66 are exposed through the insulating layer 68 during formation of the integrated circuit die 50A. In some embodiments, the die connectors 66 remain buried and are exposed during a subsequent process for packaging the integrated circuit die 50A. Exposing the die connectors 66 may remove any solder regions that may be present on the die connectors 66.

In some embodiments, the integrated circuit die 50A is a stacked device that include multiple semiconductor substrates 52. For example, the integrated circuit die 50A may be a memory device such as a hybrid memory cube (HMC) module, a high bandwidth memory (HBM) module, or the like that includes multiple memory dies. In such embodiments, the integrated circuit die 50A includes multiple semiconductor substrates 52 interconnected by throughsubstrate vias (TSVs). Each of the semiconductor substrates 52 may (or may not) have an interconnect structure 60.

Figure 2:
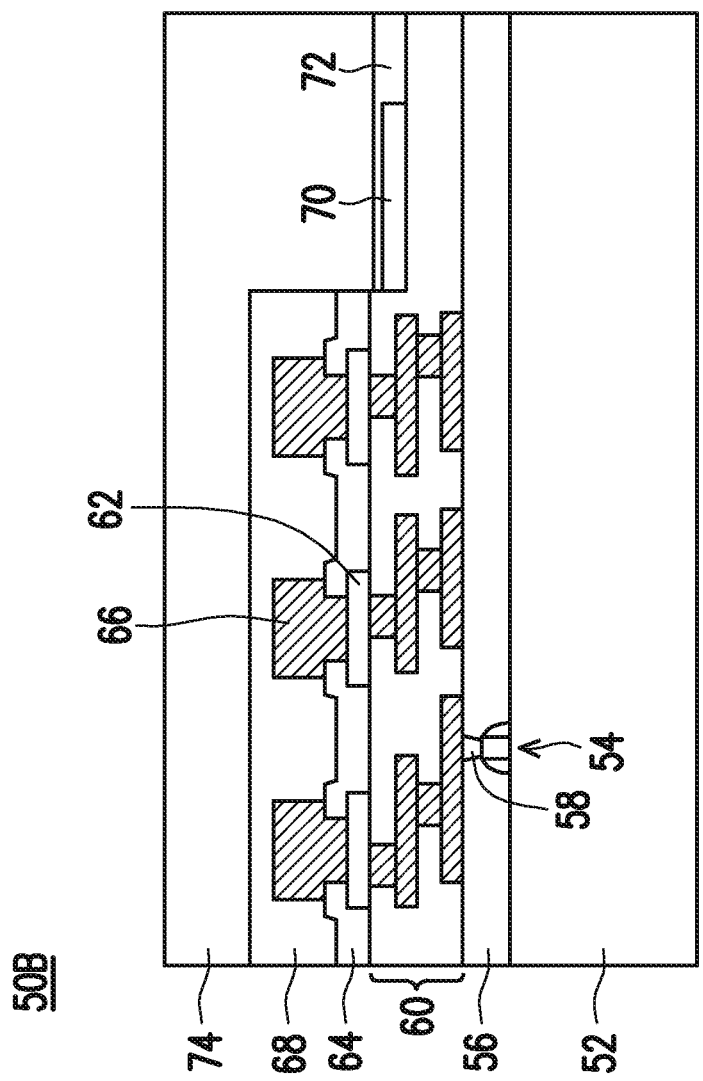
FIG. 2 illustrates a cross-sectional view of an integrated circuit die in accordance with some embodiments.

FIG. 2 illustrates a cross-sectional view of an integrated circuit die 50B in accordance with some embodiments. The integrated circuit die 50B will be packaged in subsequent processing to form an integrated circuit package. The integrated circuit die 50B may be a photonic integrated circuit (PIC) die. In some embodiments, the integrated circuit die 50B is similar to the integrated circuit die 50A (see FIG. 1), with similar features being labeled with similar numerical references, and descriptions of the similar features are not repeated herein. In some embodiments, the integrated circuit die 50B may be formed using the process steps described above with reference to FIG. 1 and the description is not repeated herein.

In some embodiments, the integrated circuit die 50B comprises an optical coupler structure that is configured to be coupled to an optical fiber. In some embodiments, the optical coupler structure comprises a silicon waveguide 70, which is coupled to the interconnect structure 60. In some embodiments, the silicon waveguide 70 comprises a layer of silicon formed over a layer of silicon oxide. In some embodiments, the passivation layers 64 and the insulating layer 68 are patterned to expose the interconnect structure 60 before forming the silicon waveguide 70. In other embodiments, the passivation layers 64 and the insulating layer 68 are formed and patterned after forming the silicon waveguide 70. The patterning process may comprise suitable photolithography and etch methods. After forming the silicon waveguide 70, an insulating layer 72 is formed over the silicon waveguide 70 and the exposed portion of the interconnect structure 60. In some embodiments, the insulating layer 72 comprises a dielectric material, such as silicon oxide, or the like. Subsequently, a sacrificial layer 74 is formed over the insulating layers 68 and 72. In some embodiments, the sacrificial layer 74 comprises polyimide, polyolefin, a combination thereof, or the like and may be formed using spin coating, or the like.

Figure 3:
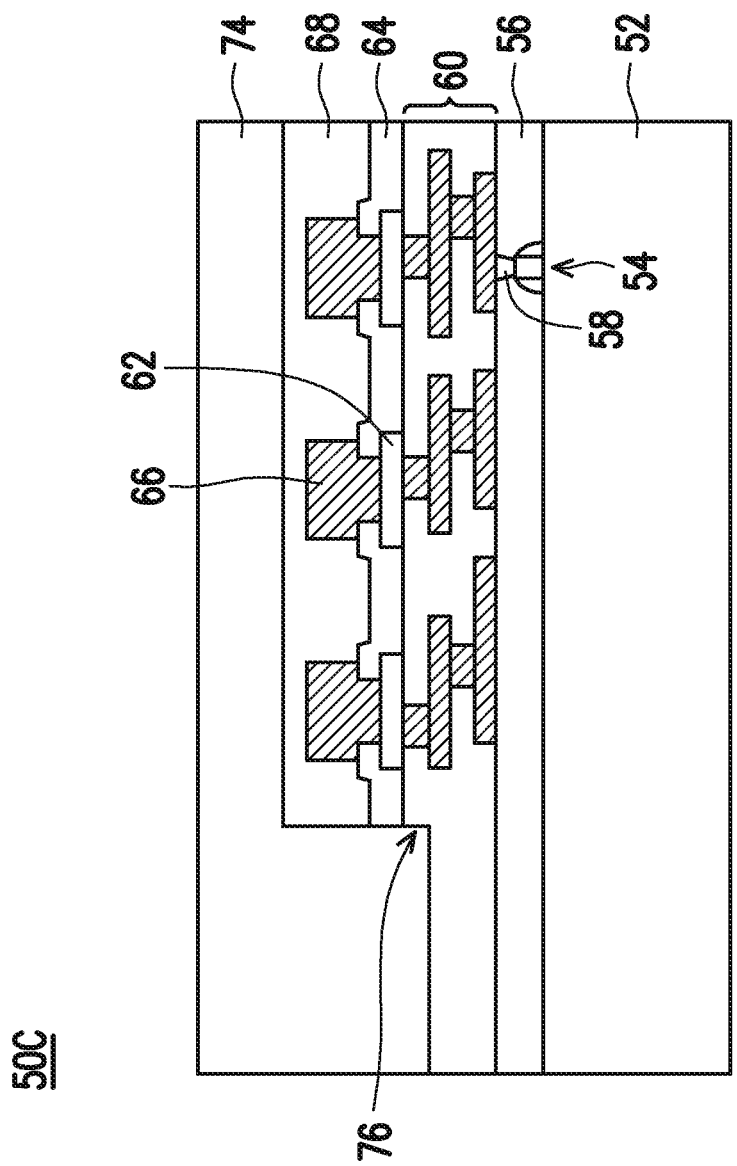
FIG. 3 illustrates a cross-sectional view of an integrated circuit die in accordance with some embodiments.

FIG. 3 illustrates a cross-sectional view of an integrated circuit die 50C in accordance with some embodiments. The integrated circuit die 50C will be packaged in subsequent processing to form an integrated circuit package. The integrated circuit die 50C may be a photonic integrated circuit (PIC) die. In some embodiments, the integrated circuit die 50C is similar to the integrated circuit die 50A (see FIG. 1), with similar features being labeled with similar numerical references, and descriptions of the similar features are not repeated herein. In some embodiments, the integrated circuit die 50C may be formed using the process steps described above with reference to FIG. 1 and the description is not repeated herein.

In some embodiments, the integrated circuit die 50C comprises an optical coupler structure that is configured to be coupled to an optical fiber. In some embodiments, the optical coupler structure comprises an edge coupler 76, which is coupled to the interconnect structure 60. The edge coupler 76 allows for lateral or in-line coupling of an optical fiber to the integrated circuit die 50C. In some embodiments, the passivation layers 64 and the insulating layer 68 are patterned to expose the interconnect structure 60 before forming to the edge coupler 76. The patterning process may comprise suitable photolithography and etch methods. Subsequently, a sacrificial layer 74 is formed over the insulating layer 68 and the interconnect structure 60. In some embodiments, the sacrificial layer 74 is formed as described above with reference to FIG. 2 and the description is not repeated herein.

Figure 4:
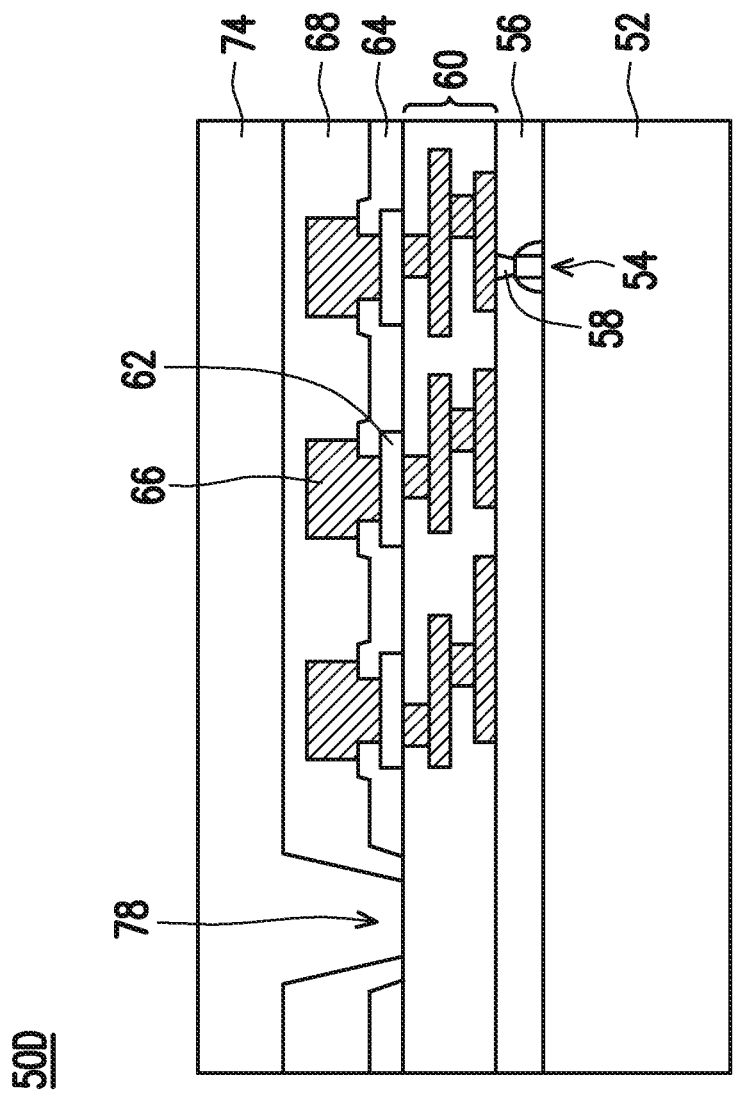
FIG. 4 illustrates a cross-sectional view of an integrated circuit die in accordance with some embodiments.

FIG. 4 illustrates a cross-sectional view of an integrated circuit die 50D in accordance with some embodiments. The integrated circuit die 50D will be packaged in subsequent processing to form an integrated circuit package. The integrated circuit die 50D may be a photonic integrated circuit (PIC) die. In some embodiments, the integrated circuit die 50D is similar to the integrated circuit die 50A (see FIG. 1), with similar features being labeled with similar numerical references, and descriptions of the similar features are not repeated herein. In some embodiments, the integrated circuit die 50D may be formed using the process steps described above with reference to FIG. 1 and the description is not repeated herein.

In some embodiments, the integrated circuit die 50D comprises an optical coupler structure that is configured to be coupled to an optical fiber. In some embodiments, the optical coupler structure comprises a grating coupler 78, which is coupled to the interconnect structure 60. The grating coupler 78 allows for vertical coupling of an optical fiber to the integrated circuit die 50D. In some embodiments, the passivation layers 64 and the insulating layer 68 are patterned to form an opening and to expose the interconnect structure 60 before forming to the grating coupler 78. The patterning process may comprise suitable photolithography and etch methods. Subsequently, a sacrificial layer 74 is formed over the insulation layer 68 and in the opening extending through the passivation layers 64 and the insulating layer 68. In some embodiments, the sacrificial layer 74 is formed as described above with reference to FIG. 2 and the description is not repeated herein.

FIGS. 5-14 illustrate cross-sectional views of intermediate steps during a process for forming a package in accordance with some embodiments. A package region 101 of a package component 100 is illustrated. In some embodiments, the package component 100 comprises a plurality of package regions, and one or more of the integrated circuit dies are packaged to form an integrated circuit package in each of the package regions. The integrated circuit packages may also be referred to as integrated fan-out (InFO) packages.

Figure 5:
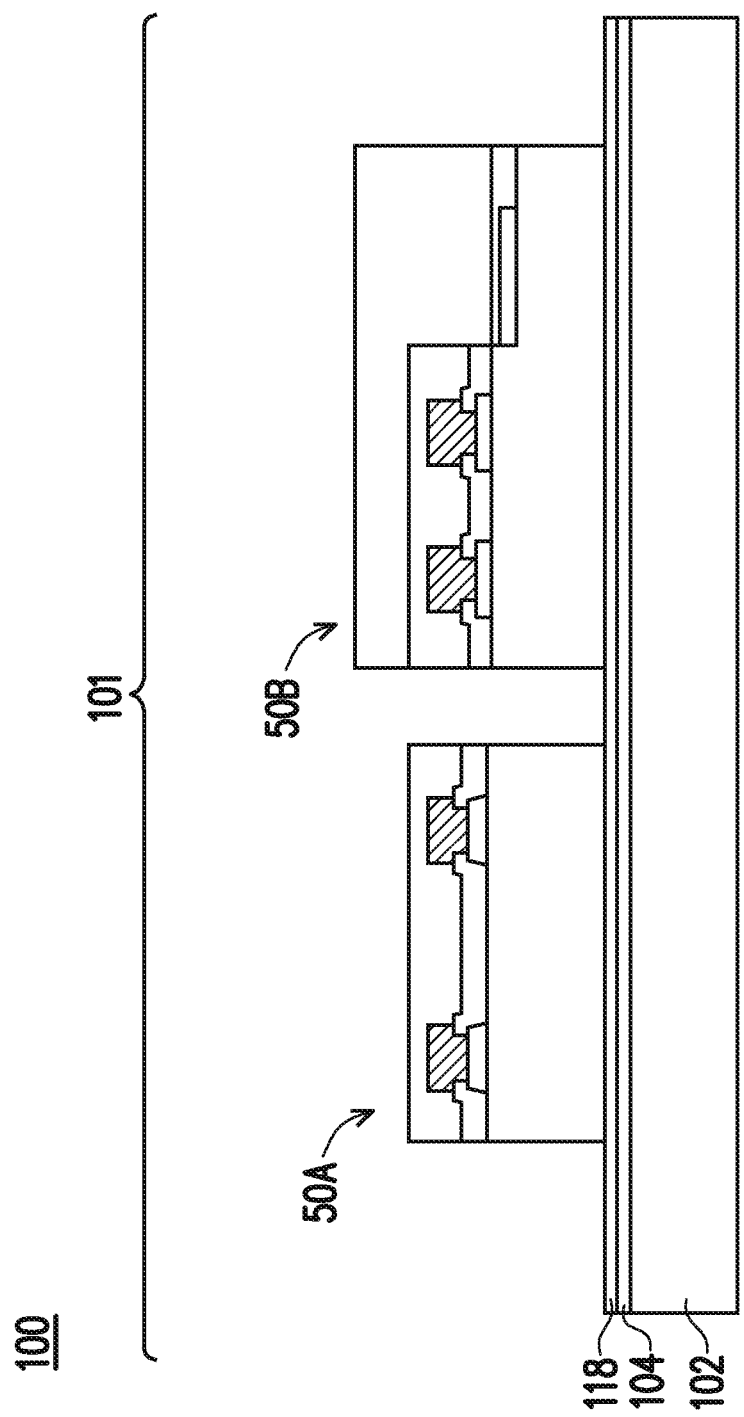
FIGS. 5-14 illustrate cross-sectional views of intermediate steps during a process for forming a package in accordance with some embodiments.

In FIG. 5, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

The integrated circuit die 50A (see FIG. 1) and the integrated circuit die 50B (see FIG. 2) are adhered to the carrier substrate 102 by an adhesive layer 118 formed over the release layer 104. The adhesive layer 118 may comprise any suitable adhesive, epoxy, die attach film (DAF), or the like.

Figure 6:
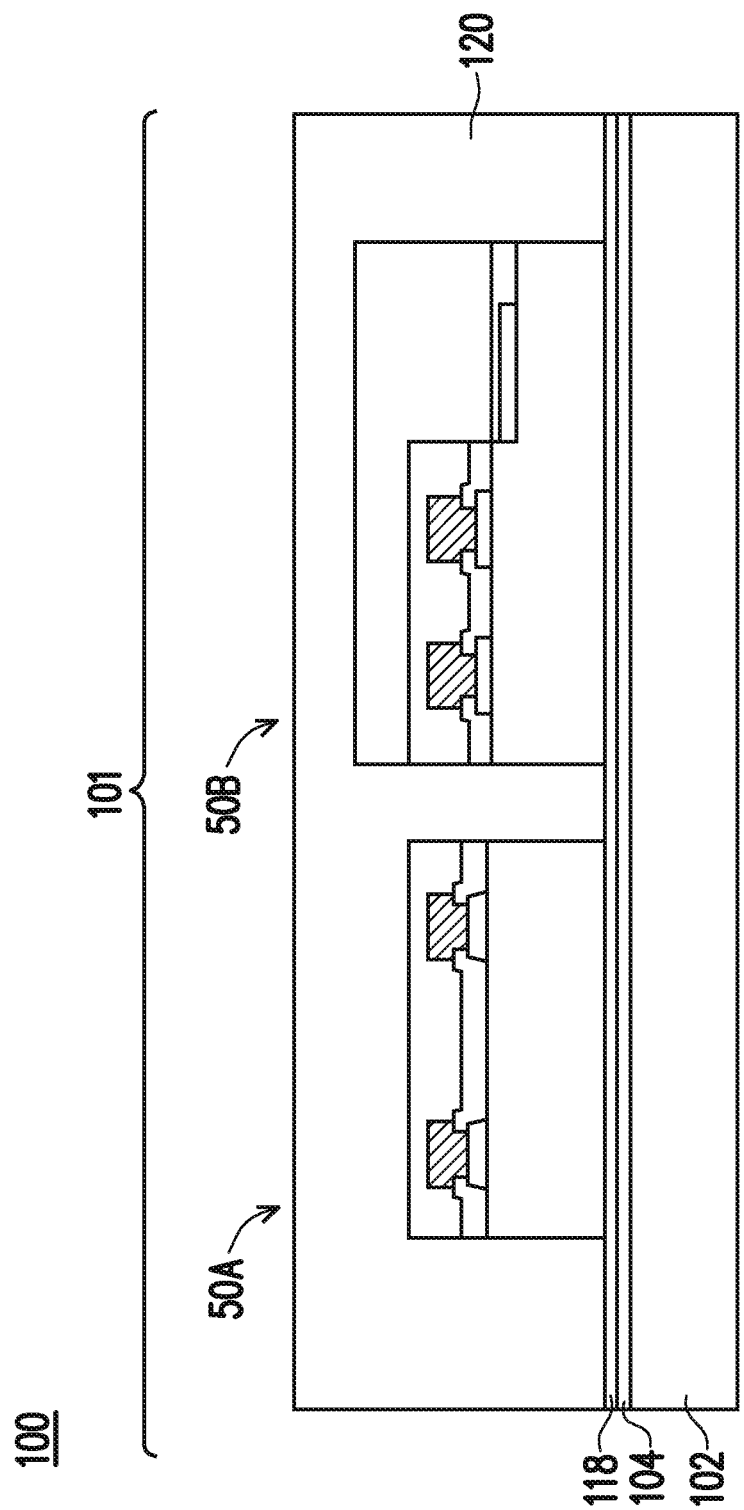

In FIG. 6, an encapsulant 120 is formed on and around the integrated circuit dies 50A and 50B. The encapsulant 120 may be a molding compound, epoxy, or the like. The encapsulant 120 may be applied by compression molding, transfer molding, or the like, and may be formed over the carrier substrate 102 such that the integrated circuit dies 50A and 50B are buried or covered. The encapsulant 120 is further formed in gap regions between the integrated circuit dies 50A and 50B. The encapsulant 120 may be applied in liquid or semi-liquid form and then subsequently cured.

Figure 7:
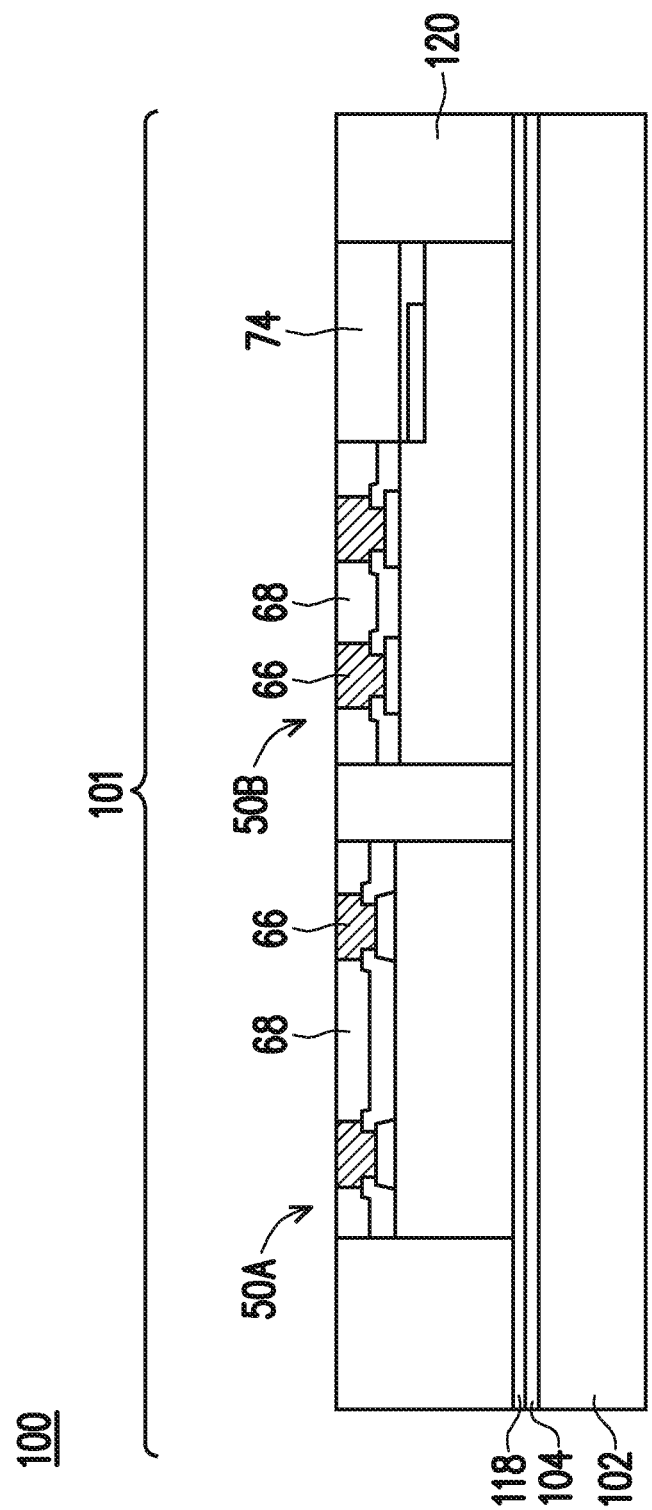

In FIG. 7, a planarization process is performed on the encapsulant 120 to expose the die connectors 66. The planarization process may also remove portions of the insulating layers 68, the sacrificial layer 74, and/or the die connectors 66 until the die connectors 66 are exposed. Top surfaces of the die connectors 66, the insulating layers 68, the sacrificial layer 74, and the encapsulant 120 are substantially coplanar after the planarization process within process variations. The planarization process may be, for example, a chemical-mechanical polish (CMP), a grinding process, or the like. In some embodiments, the planarization may be omitted, for example, if the die connectors 66 are already exposed.

Figure 8:
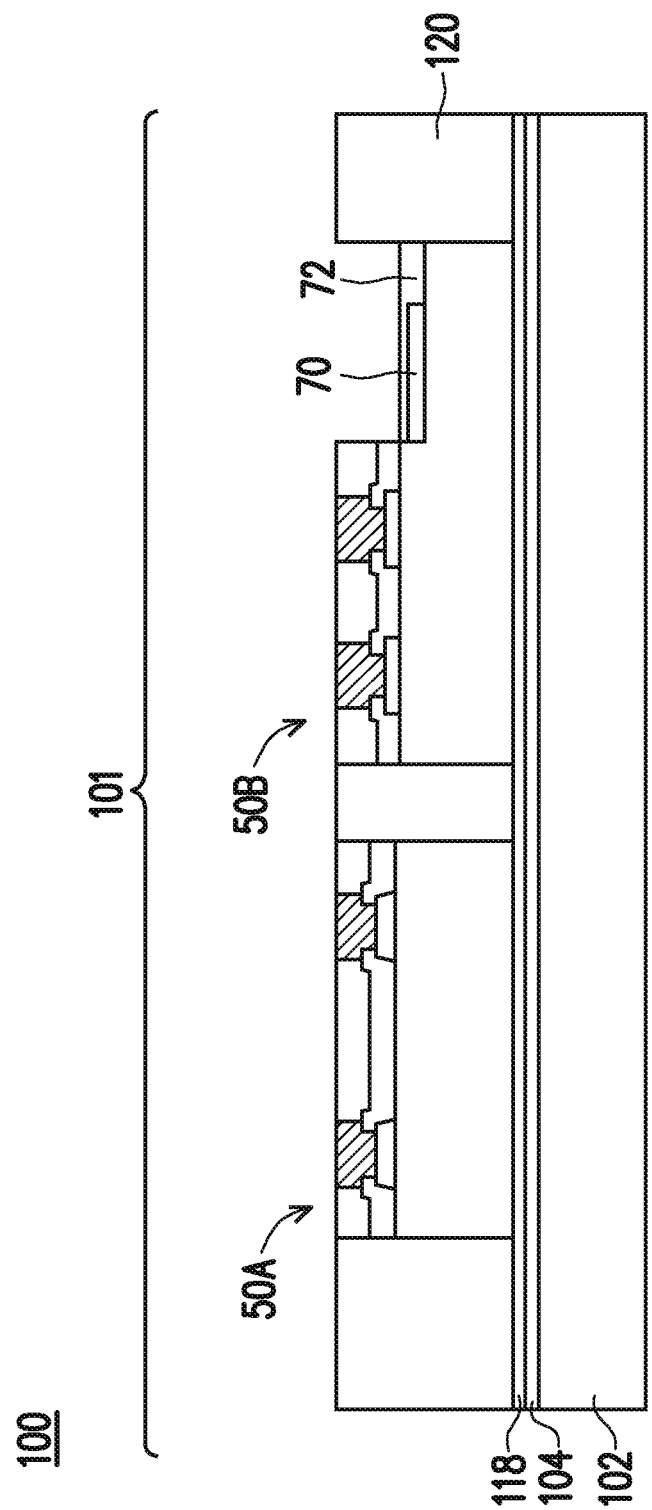

In FIG. 8, a remaining portion of the sacrificial layer 74 (see FIG. 7) is removed to expose the silicon waveguide 70 and the insulating layer 72. In some embodiments, the remaining portion of the sacrificial layer 74 may be removed by a suitable selective etch process. The selective etch process may comprise one or more suitable wet etch processes, one or more suitable dry etch processes, combinations thereof, or the like. In some embodiments, the wet etch processes may be performed using suitable strippers. In some embodiments, the dry etch processes may be performed using gasses, such as $O_2$, Ar, a combination thereof, or the like.

Figure 9:
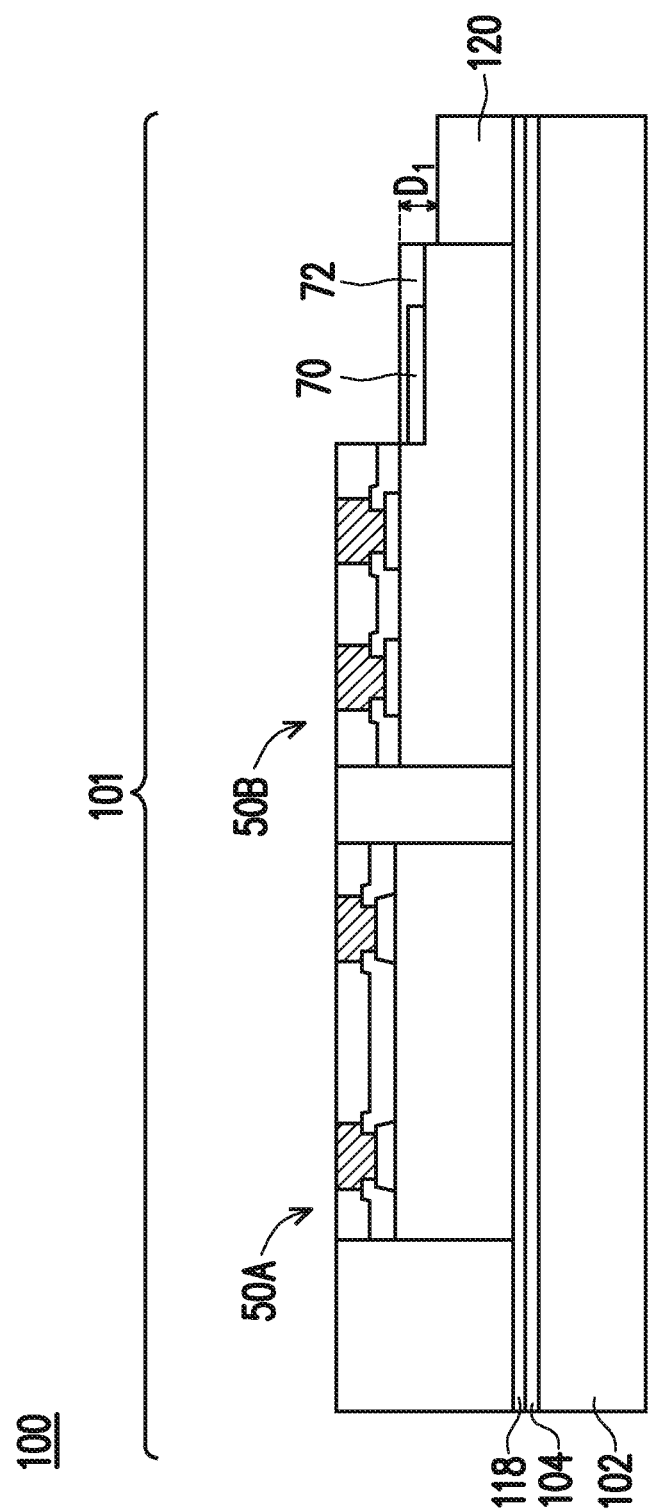

In FIG. 9, a portion of the encapsulant 120 adjacent to the insulating layer 72 is recessed below a top surface of the insulating layer 72. In some embodiments, portion of the encapsulant 120 is recessed below a top surface of the silicon waveguide 70. The recessing process may comprise suitable photolithography and etch processes. The suitable etch process may comprise a dry etch process or a wet etch process. The encapsulant 120 is recessed below the top surface of the insulating layer 72 to a depth $D_1$. The depth $D_1$ may be between about 0.1 μm and about 100 μm.

Figure 10:
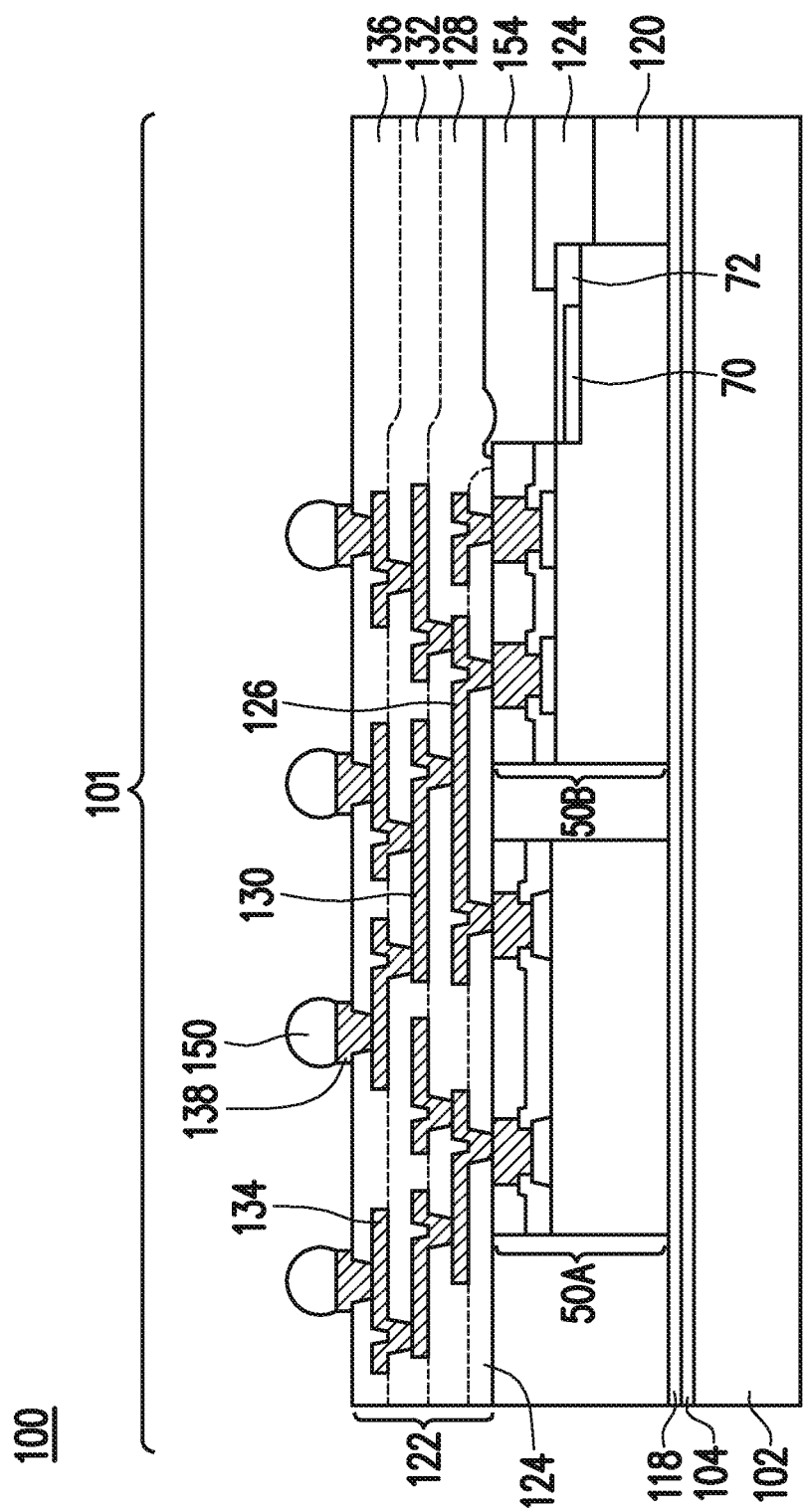

In FIG. 10, a polymer waveguide (PWG) 154 is formed over the silicon waveguide 70, and a redistribution structure 122 is formed over the encapsulant 120, the integrated circuit dies 50A and 50B, and the PWG 154. In some embodiments, the PWG 154 comprises an organic polymer, such as polyimide, polyolefin, PBO, a combination thereof, or the like.

The redistribution structure 122 includes insulating layers 124, 128, 132, and 136; and metallization patterns 126, 130, and 134. The metallization patterns may also be referred to as redistribution layers or redistribution lines. The redistribution structure 122 is shown as an example having three layers of metallization patterns. More or fewer insulating layers and metallization patterns may be formed in the redistribution structure 122. If fewer insulating layers and metallization patterns are to be formed, steps and process discussed below may be omitted. If more insulating layers and metallization patterns are to be formed, steps and processes discussed below may be repeated.

Further in FIG. 10, the insulating layer 124 is deposited on the encapsulant 120, die connectors 66 and the insulating layers 68 and 72. In some embodiments, the insulating layer 124 is formed of a photo-sensitive material such as PBO, polyimide, BCB, or the like, which may be patterned using a lithography mask. The insulating layer 124 may be formed by spin coating, lamination, CVD, the like, or a combination thereof. The insulating layer 124 is then patterned. The patterning forms openings in the insulating layer 124 exposing portions of the die connectors 66 and a portion of the insulating layer 72 disposed over the silicon waveguide 70. The patterning may be by an acceptable process, such as by exposing and developing the insulating layer 124 to light when the insulating layer 124 is a photo-sensitive material or by etching using, for example, an anisotropic etch when the insulating layer 124 is a non-photo-sensitive material.

Subsequently, the PWG 154 is formed in the opening of the insulating layer 124 exposing the insulating layer 72. In some embodiments, a first portion of the PWG 154 extends along a top surface of the insulating layer 124 and a second portion of the PWG 154 extends along a top surface of the insulating layer 68 of the integrated circuit die 50B. In some embodiments, the organic polymer material of the PWG 154 is deposited in the opening of the insulating layer 124 exposing the insulating layer 72 using spin coating, or the like. Subsequently, the organic polymer material is patterned using suitable photolithography processes.

The metallization pattern 126 is then formed. The metallization pattern 126 includes conductive elements extending along the major surface of the insulating layer 124 and extending through the insulating layer 124 to physically and electrically couple to the integrated circuit dies 50A and 50B. As an example to form the metallization pattern 126, a seed layer is formed over the insulating layer 124 and in the openings extending through the insulating layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 126, the insulating layer 128 is deposited on the metallization pattern 126, the insulating layer 124 and the PWG 154. The insulating layer 128 may be formed in a manner similar to the insulating layer 124, and may be formed of a similar material as the insulating layer 124.

The metallization pattern 130 is then formed. The metallization pattern 130 includes portions on and extending along the major surface of the insulating layer 128. The metallization pattern 130 further includes portions extending through the insulating layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

After forming the metallization pattern 130, the insulating layer 132 is deposited on the metallization pattern 130 and the insulating layer 128. The insulating layer 132 may be formed in a manner similar to the insulating layer 124, and may be formed of a similar material as the insulating layer 124.

The metallization pattern 134 is then formed. The metallization pattern 134 includes portions on and extending along the major surface of the insulating layer 132. The metallization pattern 134 further includes portions extending through the insulating layer 132 to physically and electrically couple the metallization pattern 130. The metallization pattern 134 may be formed in a similar manner and of a similar material as the metallization pattern 126. The metallization pattern 134 is the topmost metallization pattern of the redistribution structure 122. As such, all of the intermediate metallization patterns of the redistribution structure 122 (e.g., the metallization patterns 126 and 130) are disposed between the metallization pattern 134 and the integrated circuit dies 50A and 50B. In some embodiments, metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

After forming the metallization pattern 134, the insulating layer 136 is deposited on the metallization pattern 134 and insulating layer 132. The insulating layer 136 may be formed in a manner similar to the insulating layer 124, and may be formed of the same material as the insulating layer 124. The insulating layer 136 is the topmost insulating layer of the redistribution structure 122. As such, all of the metallization patterns of the redistribution structure 122 (e.g., the metallization patterns 126, 130, and 134) are disposed between the insulating layer 136 and the integrated circuit dies 50A and 50B. Further, all of the intermediate insulating layers of the redistribution structure 122 (e.g., the insulating layers 124, 128, 132) are disposed between the insulating layer 136 and the integrated circuit dies 50A and 50B. The redistribution structure 122 may be also referred to as a front-side redistribution structure.

Further in FIG. 10, after forming redistribution structure 122, under-bump metallizations (UBMs) 138 are formed for external connection to the redistribution structure 122. The UBMs 138 have bump portions on and extending along the major surface of the insulating layer 136, and have via portions extending through the insulating layer 136 to physically and electrically couple the metallization pattern 134. As a result, the UBMs 138 are electrically coupled to the integrated circuit dies 50A and 50B through the redistribution structure 122. The UBMs 138 may be formed of the same material as the metallization pattern 126. In some embodiments, the UBMs 138 has a different size than the metallization patterns 126, 130, and 134.

After forming the UBMs 138, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 11:
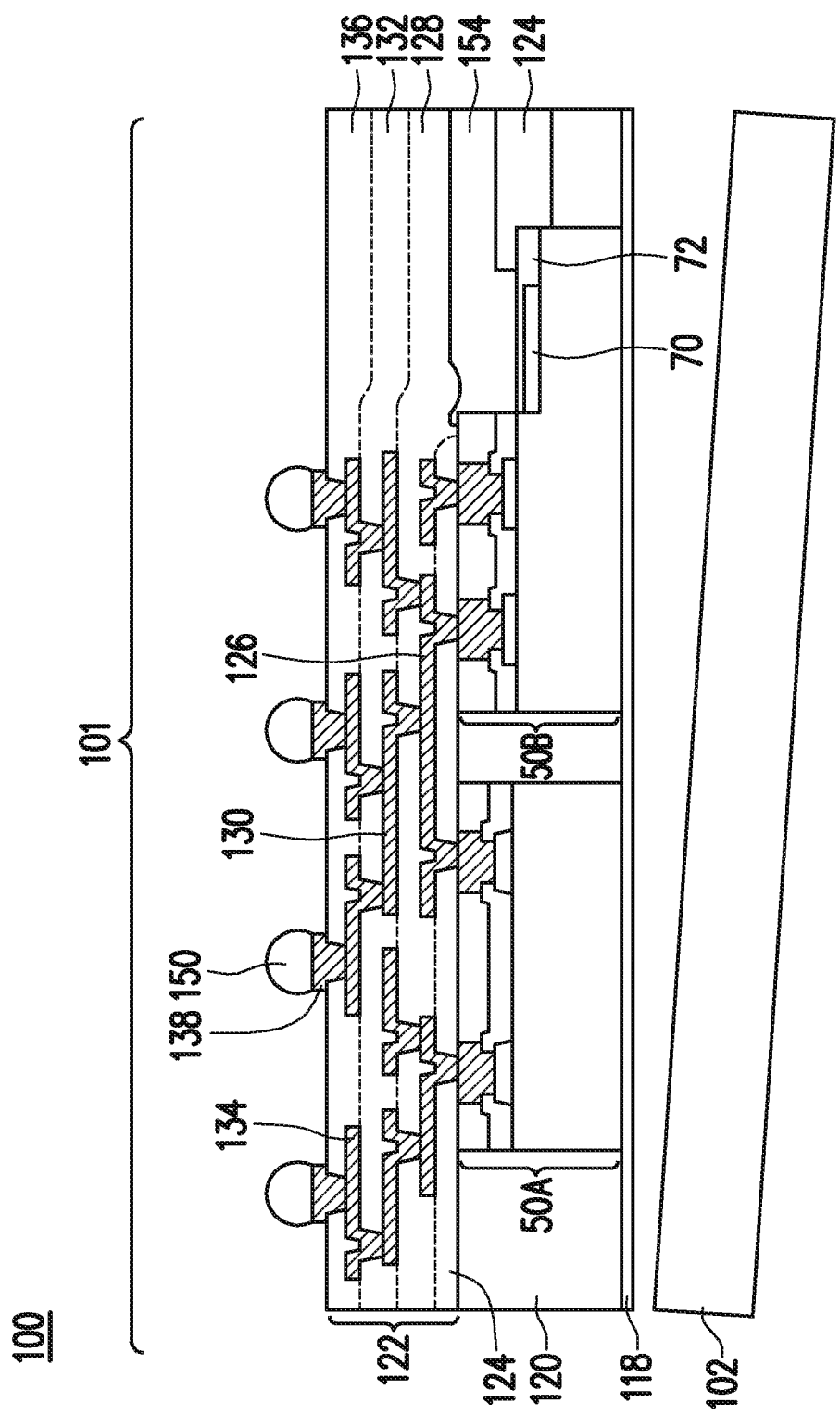

In FIG. 11, a carrier substrate de-bonding is performed to detach (or "de-bond") the carrier substrate 102 from the package component 100. In some embodiments, the de-bonding includes projecting a light such as a laser light or an UV light on the release layer 104 so that the release layer 104 decomposes under the heat of the light and the carrier substrate 102 can be removed.

Figure 12:
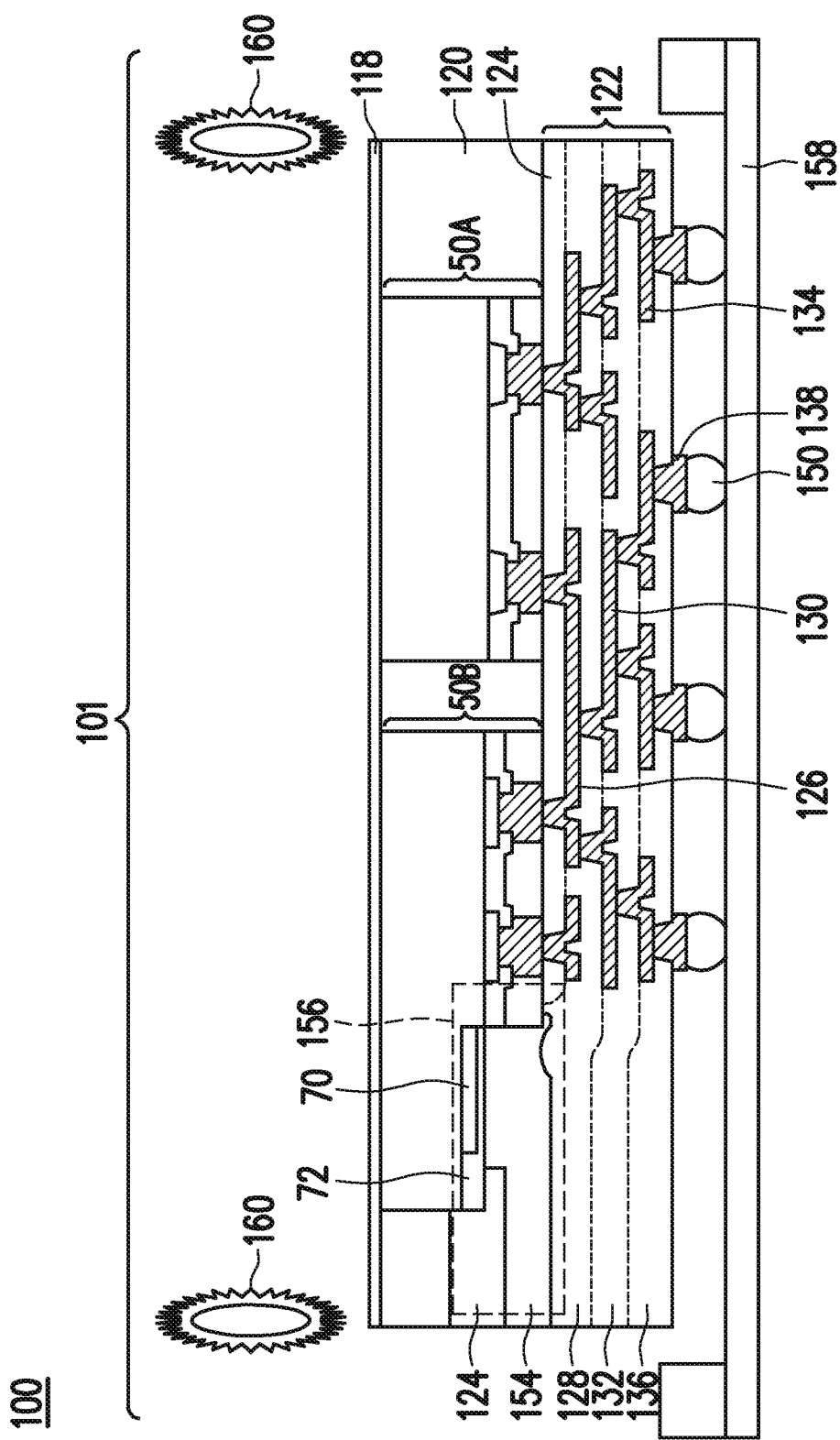

In FIG. 12, after de-bonding the carrier substrate 102, the package component 100 is flipped and is placed on a dicing tape 158. Subsequently, a singulation process 160 is performed by sawing along scribe line regions, e.g., between adjacent package regions of the package component 100. The sawing singulates the package region 101 from the rest of the package component 100 and forms a package 101.

Figure 13:
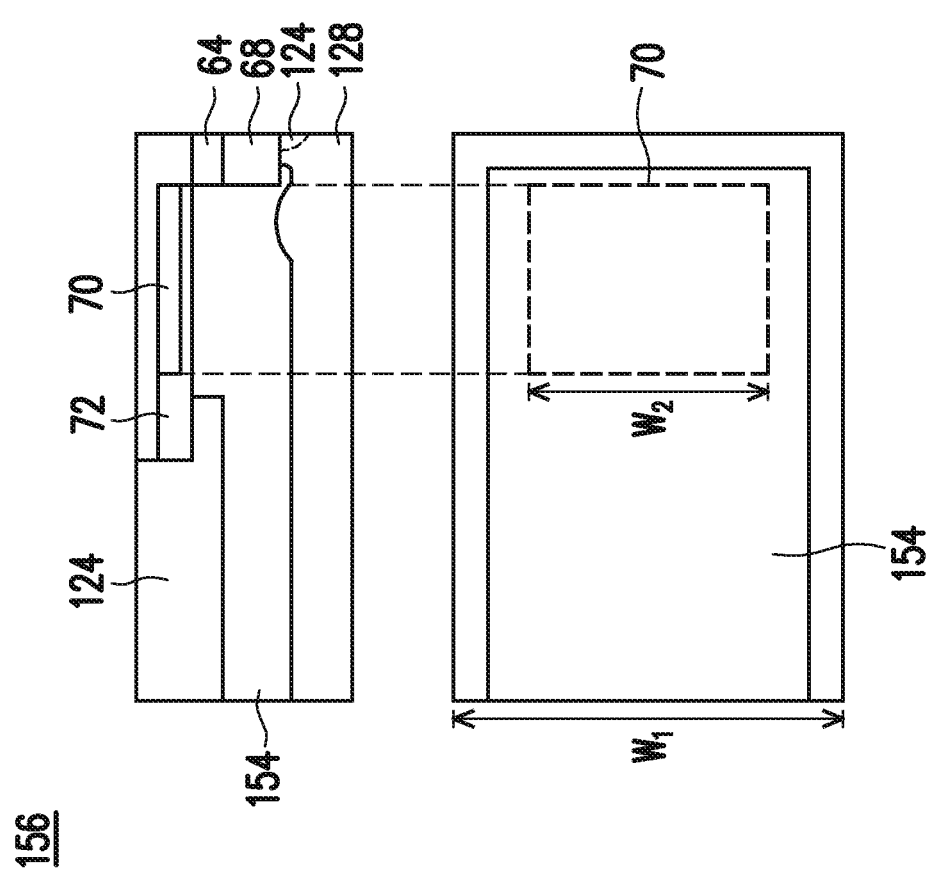

In FIG. 13, cross-sectional and plan views of a region 156 of the package region 101 illustrated in FIG. 12 is shown. In some embodiments, the PWG 154 is laterally spaced apart from the insulating layer 124, such that the insulating layer 128 is laterally interposed between the PWG 154 and the insulating layer 124. In some embodiments, a width of the silicon waveguide 70 is less than a width of the PWG 154. In some embodiments, a width $W_1$ of the PWG 154 is between about 1.3 µm and about 9 µm. In some embodiments, a width $W_2$ of the silicon waveguide 70 is between about 0.1 µm and about 0.3 µm. In some embodiments, a ratio of $W_1/W_2$ is between about 4.3 and about 90.

Figure 14:
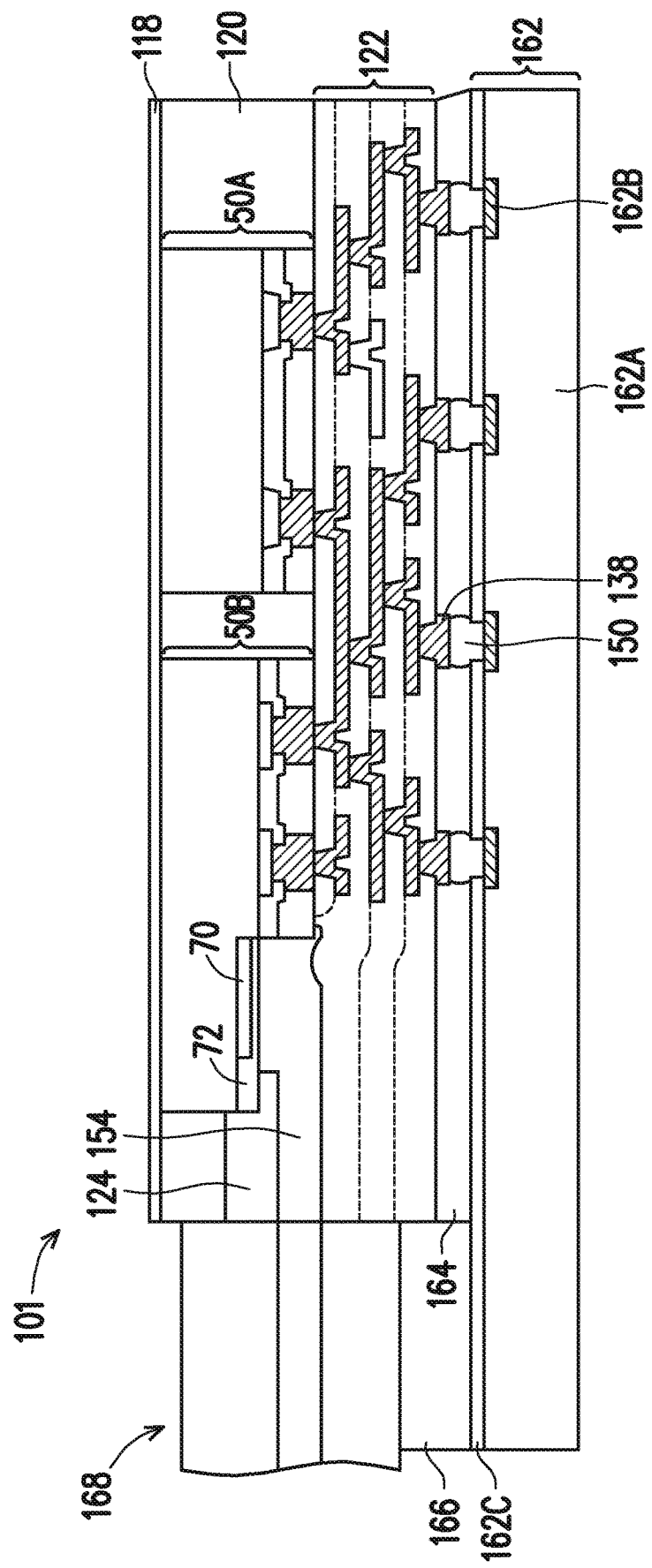

In FIG. 14, the package 101 is mounted to a package substrate 162 using the conductive connectors 150. In some embodiments, the package substrate 162 includes a substrate core 162A and bond pads 162B over the substrate core 162A. The substrate core 162A may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 162A may be a SOI substrate. Generally, an SOI substrate includes a layer of a semiconductor material such as epitaxial silicon, germanium, silicon germanium, SOI, SGOI, or combinations thereof. The substrate core 162A is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as ABF or other laminates may be used for the substrate core 162A.

The substrate core 162A may include active and passive devices (not shown). A wide variety of devices such as transistors, capacitors, resistors, combinations of these, and the like may be used to generate the structural and functional requirements of the design for the resulting device. The devices may be formed using any suitable methods.

The substrate core 162A may also include metallization layers and vias (not shown), with the bond pads 162B being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 162A is substantially free of active and passive devices.

In some embodiments, the conductive connectors 150 are reflowed to attach the package 101 to the bond pads 162B. The conductive connectors 150 electrically and/or physically couple the package substrate 162, including metallization layers in the substrate core 162A, to the package 101. In some embodiments, a solder resist 162C is formed on the substrate core 162A. The conductive connectors 150 may be disposed in openings in the solder resist 162C to be electrically and mechanically coupled to the bond pads 162B.

The solder resist 162C may be used to protect areas of the substrate core 162A from external damage.

In some embodiments, an underfill 164 may be formed between the package 101 and the package substrate 162 and surrounding the conductive connectors 150. The underfill 164 may be formed by a capillary flow process after the package 101 is attached to the package substrate 162 or may be formed by a suitable deposition method before the package 101 is attached to the package substrate 162.

In some embodiments, passive devices (e.g., surface mount devices (SMDs), not shown) may also be attached to the package 101 (e.g., to the UBMs 138) or to the package substrate 162 (e.g., to the bond pads 162B). For example, the passive devices may be bonded to a same surface of the package 101 or the package substrate 162 as the conductive connectors 150. The passive devices may be attached to the package 101 prior to mounting the package 101 on the package substrate 162, or may be attached to the package substrate 162 prior to or after mounting the package 101 on the package substrate 162.

In some embodiments, an optical fiber 168 is attached to the package substrate 162 using an adhesive layer 166 and is coupled to the PWG 154 of the package 101. The adhesive layer 166 may be formed using similar materials and methods as the adhesive layer 118 described above with reference to FIG. 5 and the description is not repeated herein. In some embodiments, the PWG 154 couples the optical fiber 168 to the silicon waveguide 70.

FIGS. 15-22 illustrate cross-sectional views of intermediate steps during a process for forming a package in accordance with some embodiments. Some of features and process steps described with reference to FIGS. 15-22 are similar to the features and the process steps described above with reference to FIGS. 5-14, with similar features being labeled with similar numerical references, and descriptions of the similar features and the similar process steps are not repeated herein.

In FIGS. 15-22, a package region 201 of a package component 200 is illustrated. In some embodiments, the package component 200 comprises a plurality of package regions, and one or more of the integrated circuit dies are packaged to form an integrated circuit package in each of the package regions. The integrated circuit packages may also be referred to as InFO packages.

Figure 15:
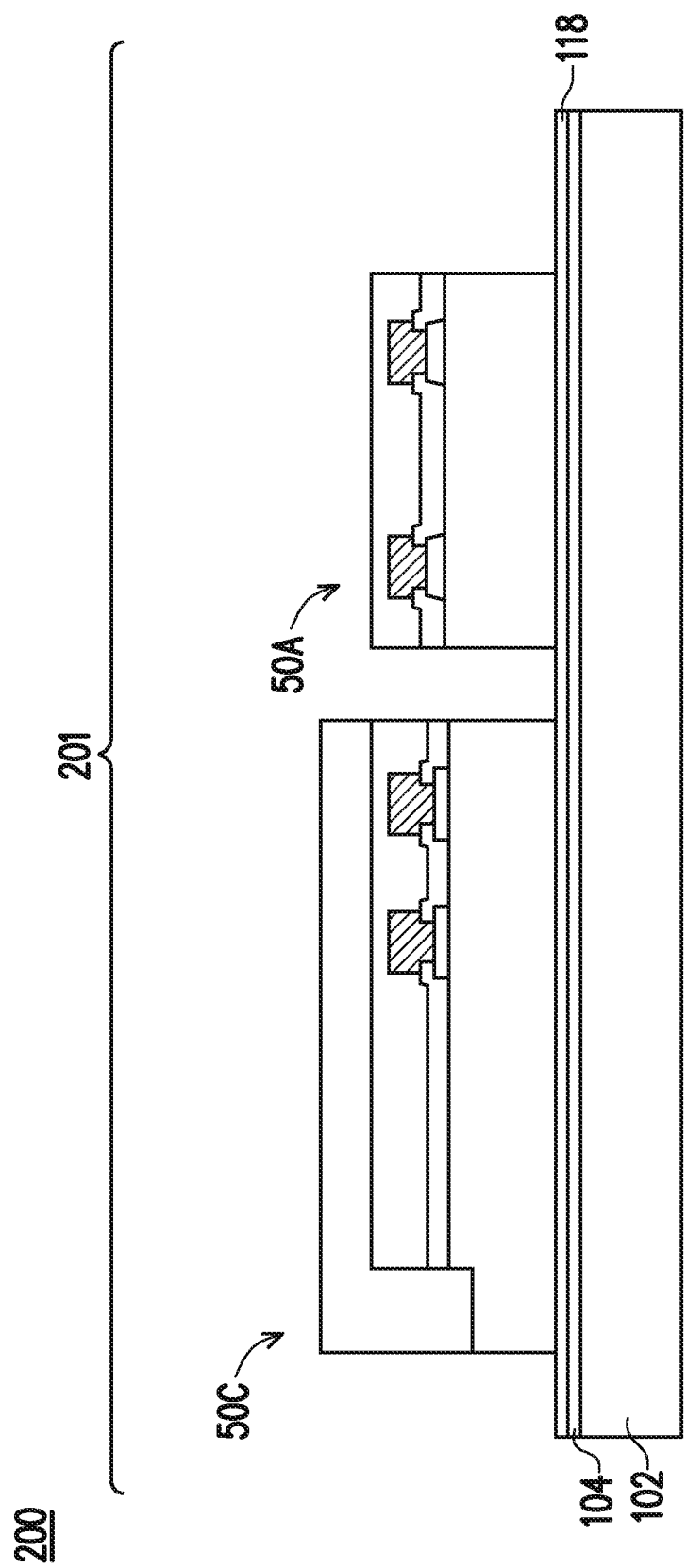
FIGS. 15-22 illustrate cross-sectional views of intermediate steps during a process for forming a package in accordance with some embodiments.

In FIG. 15, a carrier substrate 102 is provided, and a release layer 104 is formed on the carrier substrate 102. The carrier substrate 102 may be a wafer, such that multiple packages can be formed on the carrier substrate 102 simultaneously. The integrated circuit die 50A (see FIG. 1) and the integrated circuit die 50C (see FIG. 3) are adhered to the carrier substrate 102 by an adhesive layer 118 formed over the release layer 104.

Figure 16:
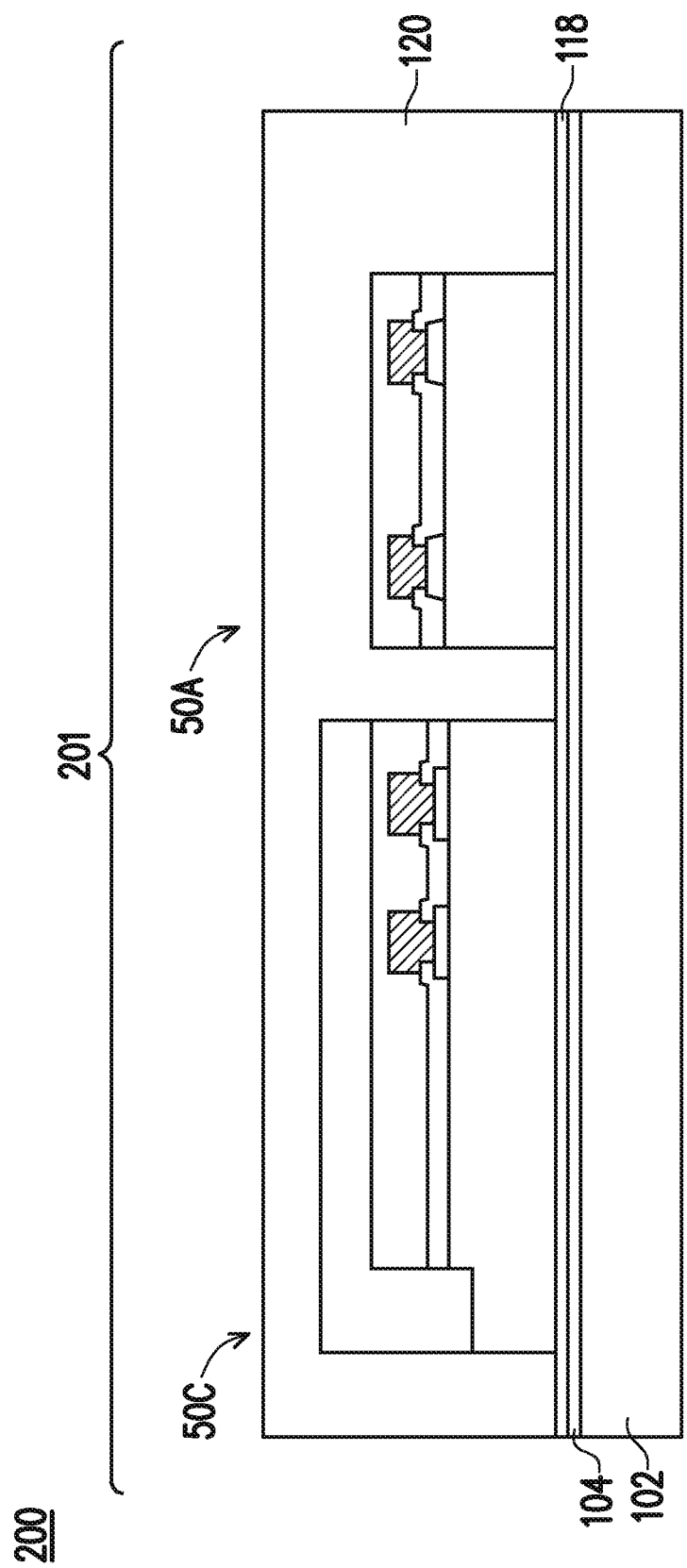

In FIG. 16, an encapsulant 120 is formed on and around the integrated circuit dies 50A and 50C. The encapsulant 120 may be formed over the carrier substrate 102 such that the integrated circuit dies 50A and 50C are buried or covered. The encapsulant 120 is further formed in gap regions between the integrated circuit dies 50A and 50C. In some embodiments, the encapsulant 120 may be formed as described above with reference to FIG. 6 and the description is not repeated herein.

Figure 17:
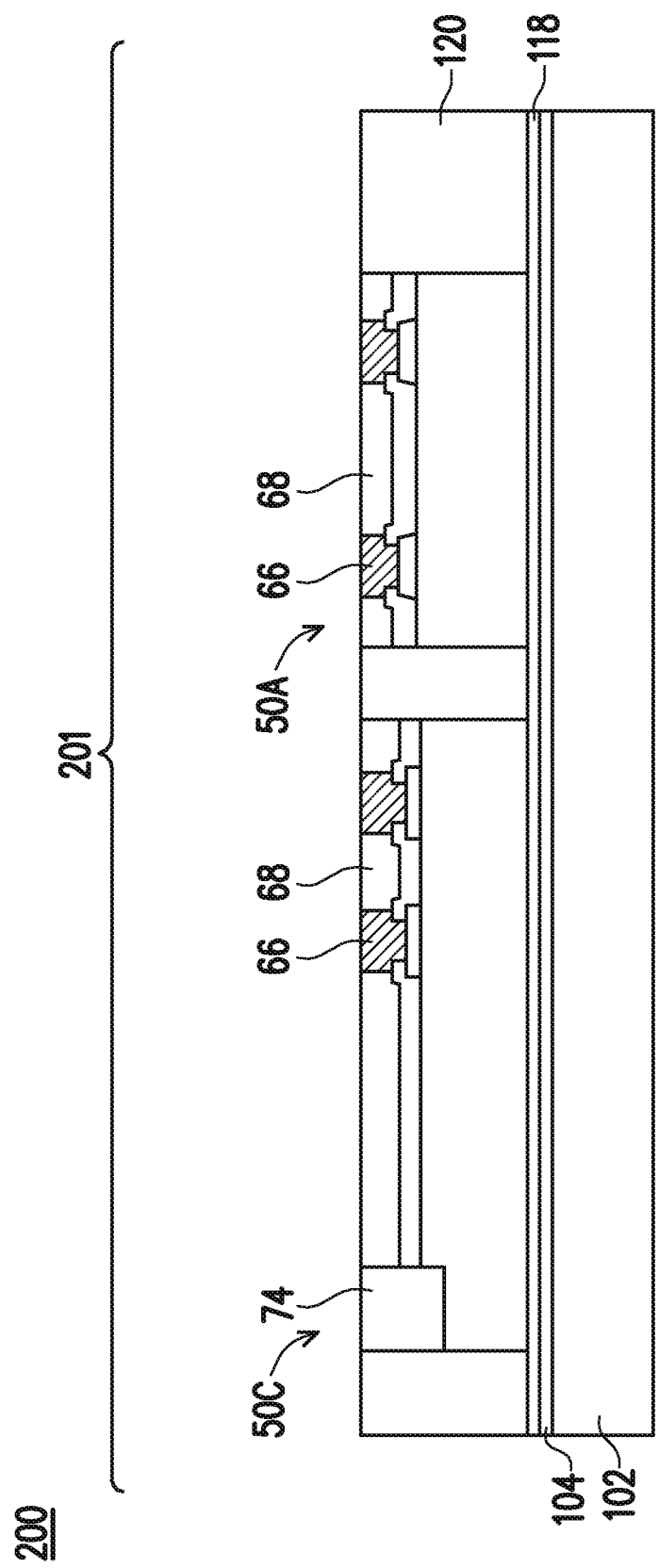

In FIG. 17, a planarization process is performed on the encapsulant 120 to expose the die connectors 66. The planarization process may also remove portions of the insulating layers 68, the sacrificial layer 74, and/or the die connectors 66 until the die connectors 66 are exposed. Top surfaces of the die connectors 66, the insulating layers 68, the sacrificial layer 74, and the encapsulant 120 are substantially coplanar after the planarization process within process variations. The planarization process may be, for example, a CMP, a grinding process, or the like. In some embodiments, the planarization may be omitted, for example, if the die connectors 66 are already exposed.

Figure 18:
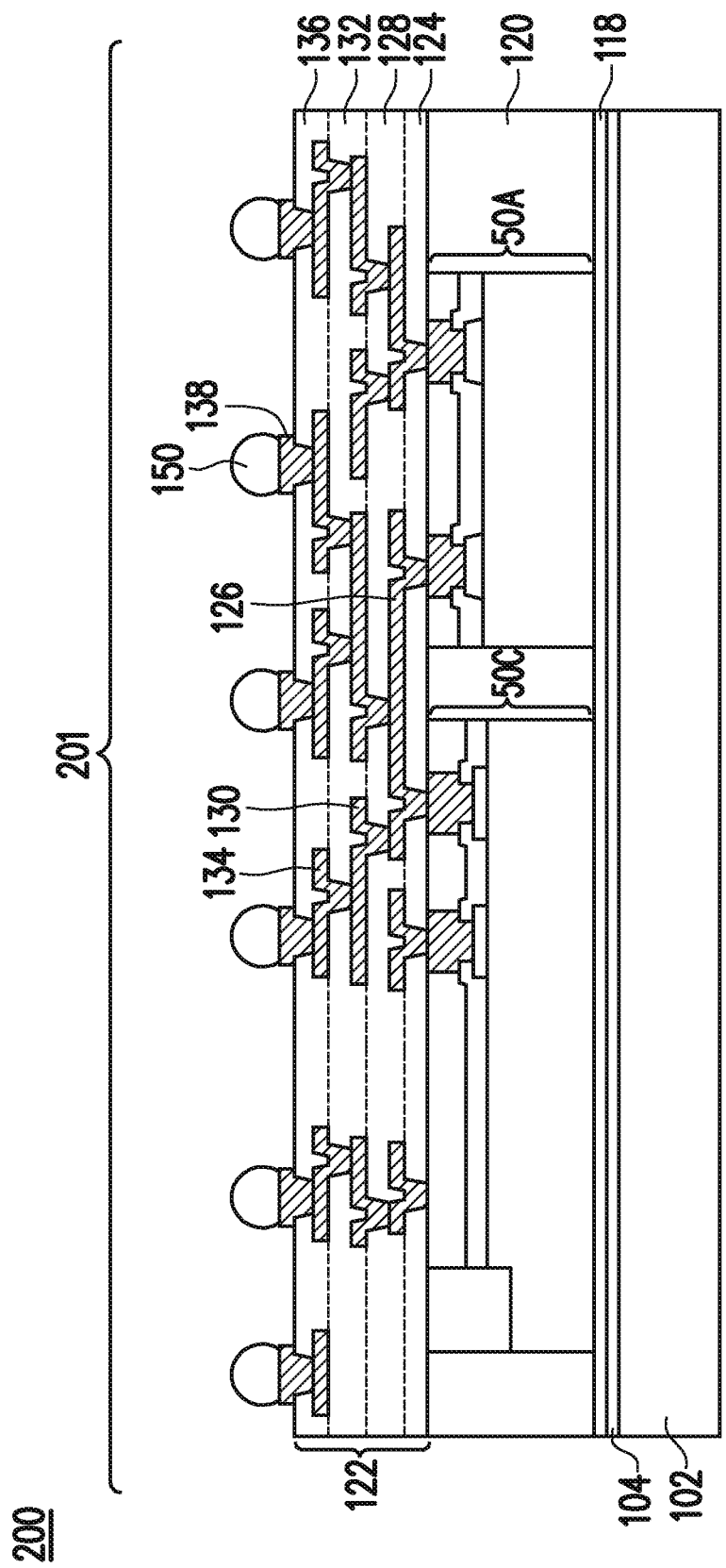

In FIG. 18, a redistribution structure 122 is formed over the encapsulant 120 and the integrated circuit dies 50A and 50C. Subsequently, under-bump metallizations (UBMs) 138 are formed for external connection to the redistribution structure 122. After forming the UBMs 138, conductive connectors 150 are formed on the UBMs 138. In some embodiments, the redistribution structure 122, the UBMs 138, and the conductive connectors 150 may be formed as described above with reference to FIG. 10 and the description is not repeated herein.

Figure 19:
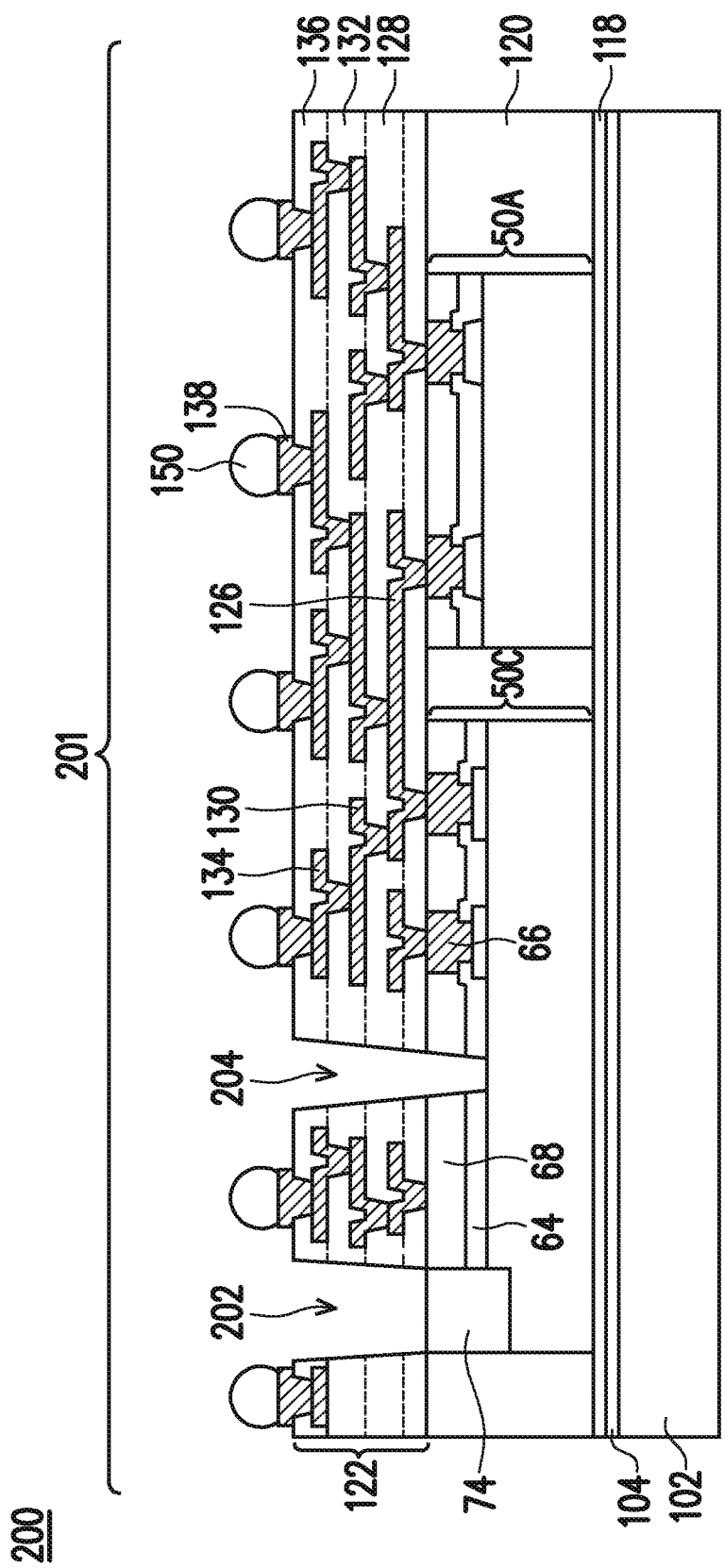

In FIG. 19, the redistribution structure 122, the passivation layer 64 and the insulating layer 68 of the integrated circuit die 50C are patterned to form openings 202 and 204. The patterning process may comprise suitable photolithography and etch methods. The suitable etch method may include one or more dry etch processes, one or more wet etch process, combinations thereof, or the like. The opening 202 extends though the insulating layers 124, 128, 132, and 136 and exposes the sacrificial layer 74. The opening 204 extends though the insulating layers 124, 128, 132 and 136, and through the passivation layer 64 and the insulating layer 68 of the integrated circuit die 50C. In some embodiments, the opening 204 is used for an external laser source input.

Figure 20:
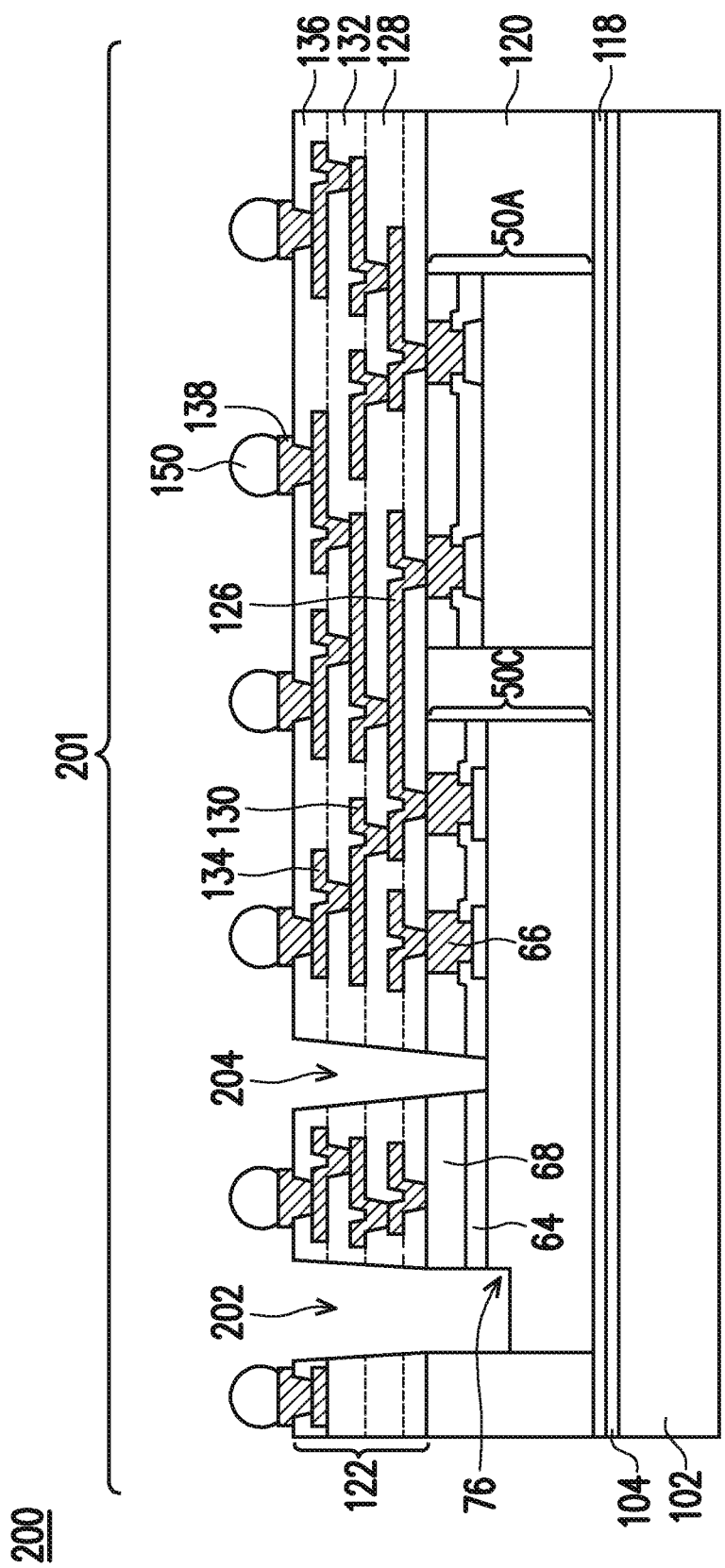

In FIG. 20, the sacrificial layer 74 is removed through the opening 202 to expose the edge coupler 76 of the integrated circuit die 50C. In some embodiments, the sacrificial layer 74 is removed as described above with reference to FIG. 8 and the description is not repeated herein.

Figure 21:
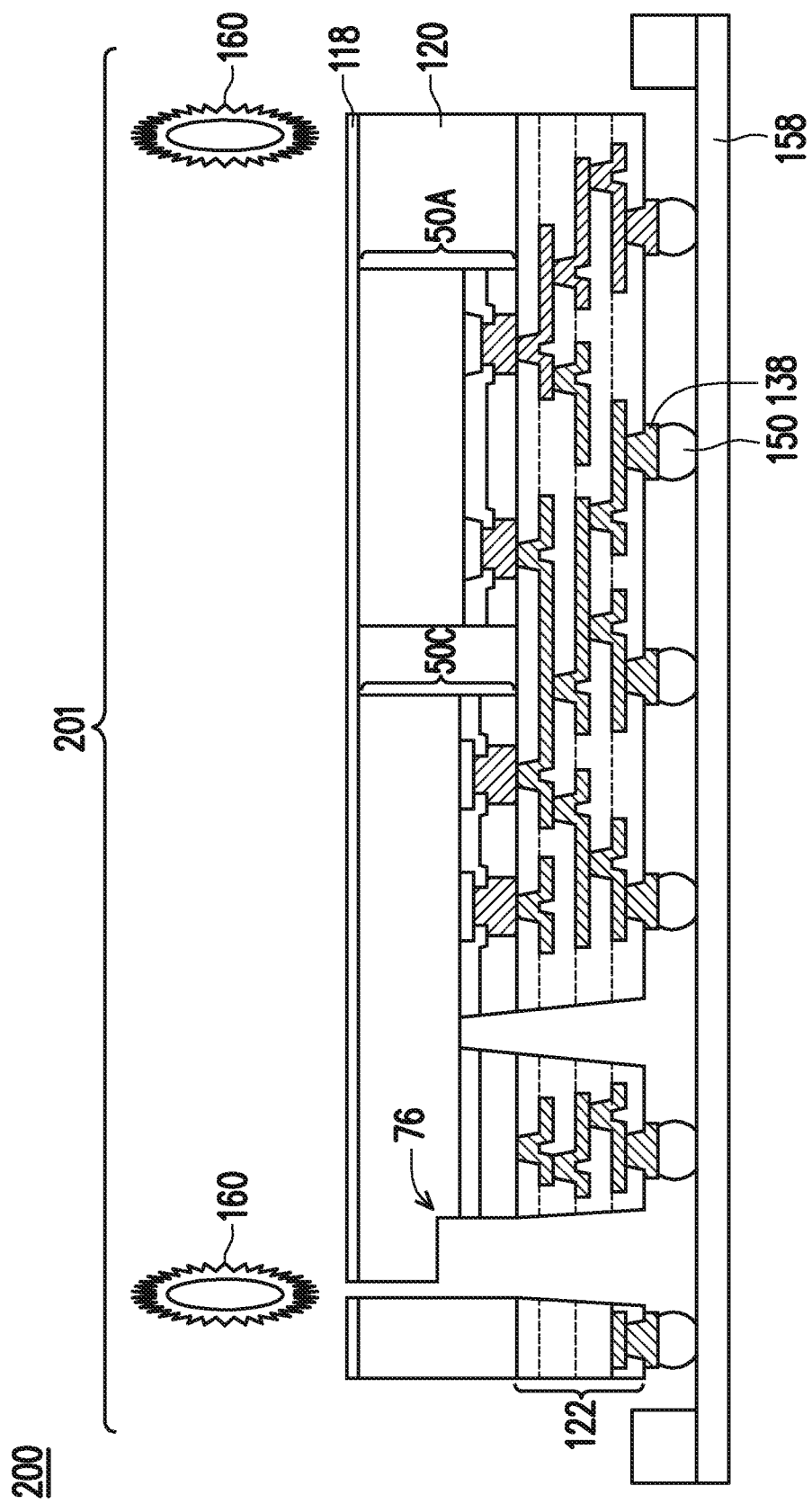

In FIG. 21, a carrier substrate de-bonding is performed to detach (or "de-bond") the carrier substrate 102 from the package component 200. In some embodiments, the de-bonding may be performed as described above with reference to FIG. 11 and the description is not repeated herein. After de-bonding the carrier substrate 102, the package component 200 is flipped and is placed on a dicing tape 158. Subsequently, a singulation process 160 is performed by sawing along scribe line regions, e.g., between adjacent package regions of the package component 200. The sawing singulates the package region 201 from the rest of the package component 200 and forms a package 201. In some embodiments, after the singulation process 160, a sidewall of the package 201 nearest to the edge coupler 76 is free of encapsulant 120.

Figure 22:
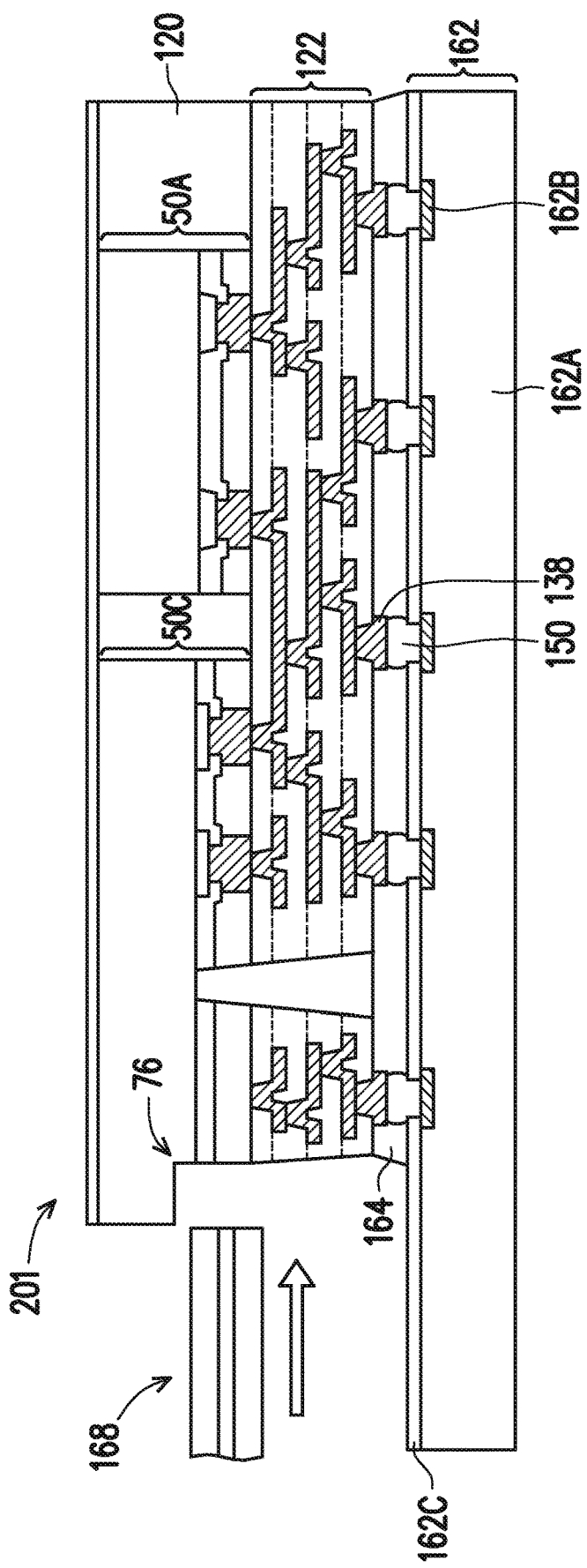

In FIG. 22, the package 201 is mounted to a package substrate 162 using the conductive connectors 150. In some embodiments, the package 201 is mounted to the package substrate 162 as described above with reference to FIG. 14 and the description is not repeated herein. In some embodiments, passive devices (e.g., surface mount devices (SMDs), not shown) may also be attached to the package 201 (e.g., to the UBMs 138) or to the package substrate 162 (e.g., to the bond pads 162B). For example, the passive devices may be bonded to a same surface of the package 201 or the package substrate 162 as the conductive connectors 150. The passive devices may be attached to the package 201 prior to mounting the package 201 on the package substrate 162, or may be attached to the package substrate 162 prior to or after mounting the package 201 on the package substrate 162.

In some embodiments, an underfill 164 may be formed between the package 201 and the package substrate 162 and surrounding the conductive connectors 150. In some embodiments, the underfill 164 may be formed as described above with reference to FIG. 14 and the description is not repeated herein. In other embodiments, the underfill 164 may be omitted.

Further in FIG. 22, an optical fiber 168 is coupled to the edge coupler 76 of the integrated circuit die 50C. By performing the singulation process such that the sidewall of the package 201 nearest to the edge coupler 76 is free of the encapsulant 120, the coupling of the optical fiber 168 to the edge coupler 76 of the integrated circuit die 50C is not prevented.

FIGS. 23-32 illustrate cross-sectional views of intermediate steps during a process for forming a package in accordance with some embodiments. Some of features and process steps described with reference to FIGS. 23-32 are similar to the features and the process steps described above with reference to FIGS. 5-14, with similar features being labeled with similar numerical references, and descriptions of the similar features and the similar process steps are not repeated herein.

In FIGS. 23-32, a package region 301 of a package component 300 is illustrated. In some embodiments, the package component 300 comprises a plurality of package regions, and one or more of the integrated circuit dies are packaged to form an integrated circuit package in each of the package regions. The integrated circuit packages may also be referred to as InFO packages.

Figure 23:
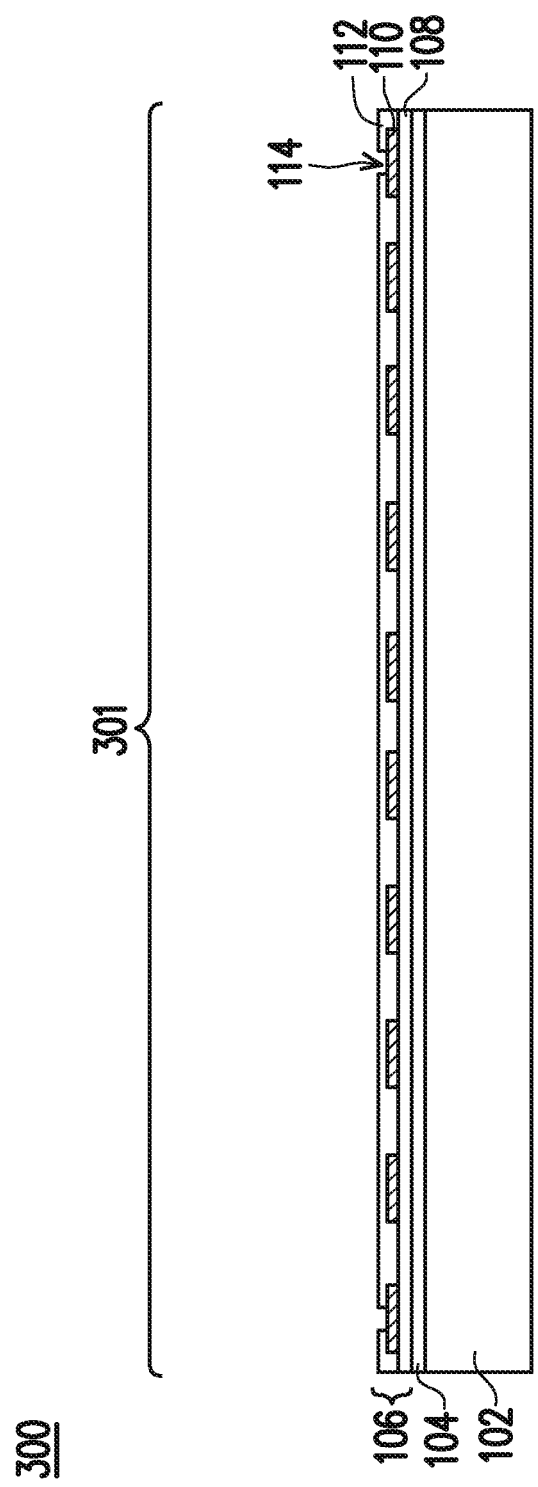
FIGS. 23-32 illustrate cross-sectional views of intermediate steps during a process for forming a package in accordance with some embodiments.

In FIG. 23, a carrier substrate 102 is provided, and a release layer 104 is formed on the carrier substrate 102. The carrier substrate 102 may be a wafer, such that multiple packages can be formed on the carrier substrate 102 simultaneously. In some embodiments, a redistribution structure 106 is formed on the release layer 104. In the embodiment shown, the redistribution structure 106 includes an insulating layer 108, a metallization pattern 110 (sometimes referred to as redistribution layers or redistribution lines), and an insulating layer 112. In other embodiments, the redistribution structure 106 may be omitted. In some embodiments, an insulating layer without metallization patterns is formed on the release layer 104 in lieu of the redistribution structure 106. The redistribution structure 106 may be also referred to as a back-side redistribution structure.

The insulating layer 108 may be formed on the release layer 104. The bottom surface of the insulating layer 108 may be in contact with the top surface of the release layer 104. In some embodiments, the insulating layer 108 is formed of a polymer, such as PBO, polyimide, BCB, or the like. In other embodiments, the insulating layer 108 is formed of a nitride such as silicon nitride; an oxide such as silicon oxide, PSG, BSG, BPSG, or the like; or the like. The insulating layer 108 may be formed by any acceptable deposition process, such as spin coating, CVD, laminating, the like, or a combination thereof.

The metallization pattern 110 may be formed on the insulating layer 108. As an example to form the metallization pattern 110, a seed layer is formed over the insulating layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The insulating layer 112 is formed on the metallization pattern 110 and the insulating layer 108. In some embodiments, the insulating layer 112 may be formed using similar materials and methods as the insulating layer 108 and the description is not repeated herein. The insulating layer 112 is then patterned to form openings 114 exposing portions of the metallization pattern 110. The patterning may be formed by an acceptable process, such as by exposing the insulating layer 112 to light when the insulating layer 112 is a photo-sensitive material or by etching using, for example, an anisotropic etch when the insulating layer 112 is a non-photo-sensitive material. If the insulating layer 112 is a photo-sensitive material, the insulating layer 112 may be developed after the exposure.

FIG. 23 illustrates a redistribution structure 106 having a single metalization pattern 110 for illustrative purposes. In some embodiments, the redistribution structure 106 may include any number of insulating layers and metallization patterns. If more insulating layers and metallization patterns are to be formed, steps and processes discussed above may be repeated.

Figure 24:
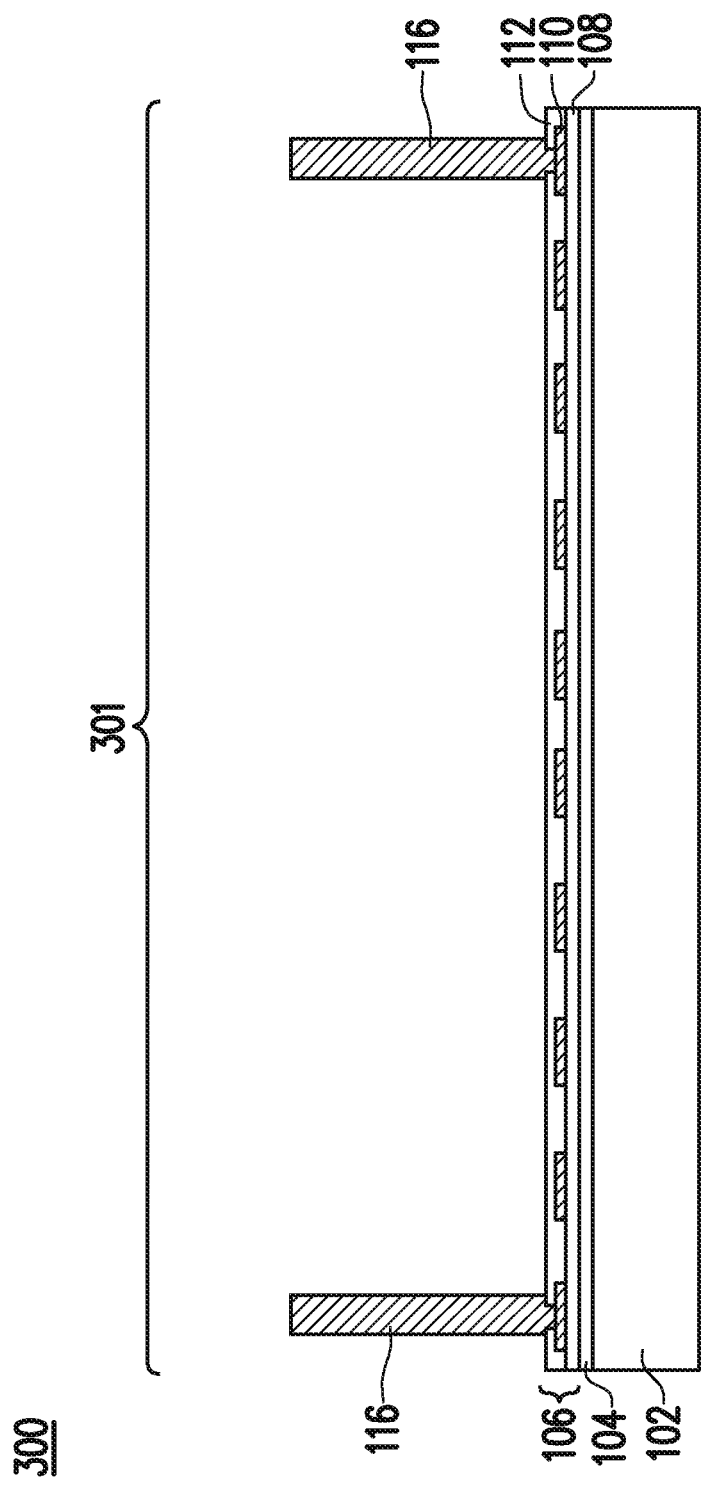

In FIG. 24, through vias 116 are formed in the openings 114 (see FIG. 23) and extend away from the topmost insulating layer of the redistribution structure 106 (e.g., the insulating layer 112). As an example to form the through vias 116, a seed layer (not shown) is formed over the redistribution structure 106, e.g., on the insulating layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 25:
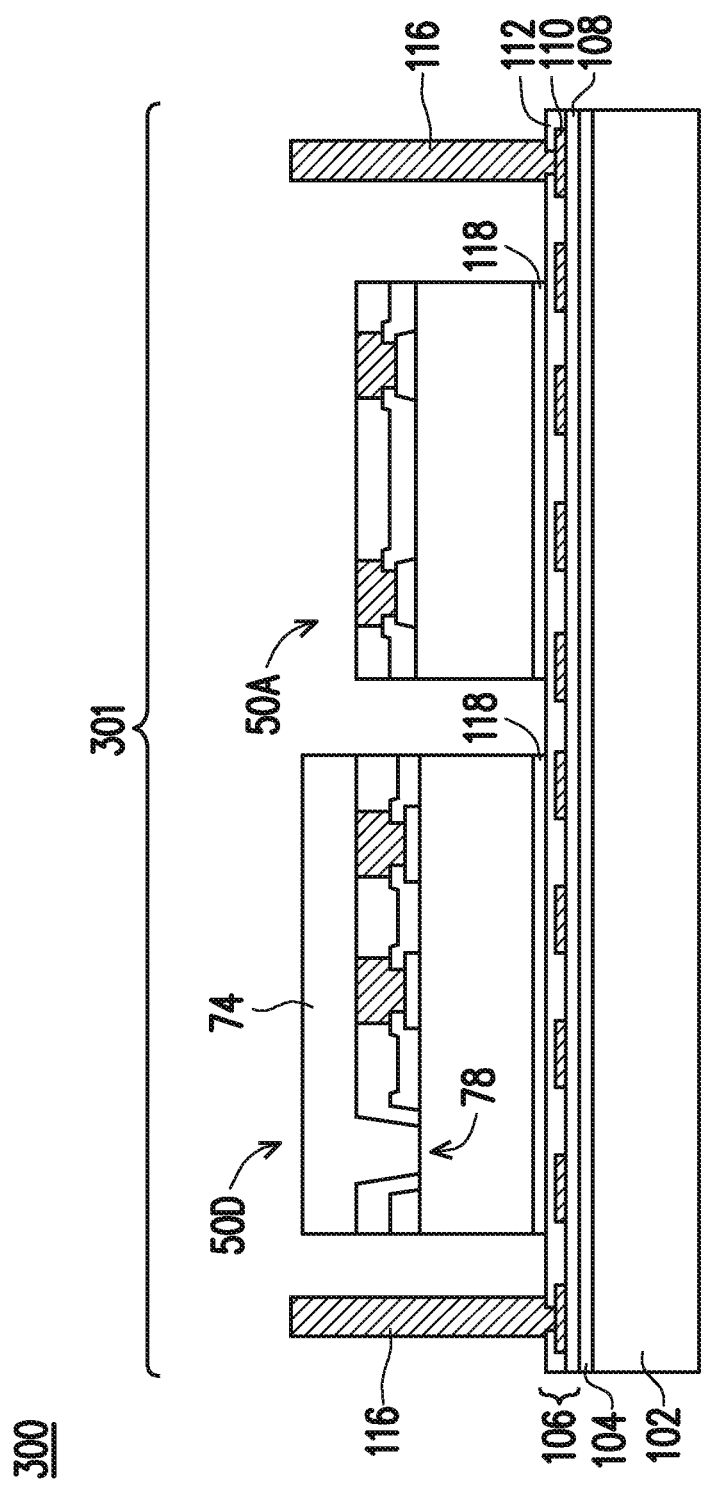

In FIG. 25, an integrated circuit die 50A (see FIG. 1) and an integrated circuit die 50D (see FIG. 4) are adhered to the insulating layer 112 by adhesive layers 118. The adhesive layers 118 are formed on back-sides of the integrated circuit dies 50A and 50D and adhere the integrated circuit dies 50A and 50D to the redistribution structure 106, such as to the insulating layer 112. The adhesive layers 118 may be applied to back-sides of the integrated circuit dies 50A and 50D, may be applied over the surface of the carrier substrate 102 if no redistribution structure 106 is utilized, or may be applied to an upper surface of the redistribution structure 106 if applicable. For example, the adhesive layers 118 may be applied to the back-sides of the integrated circuit die 50A and 50D before singulating to separate the integrated circuit dies 50A and 50D.

Figure 26:
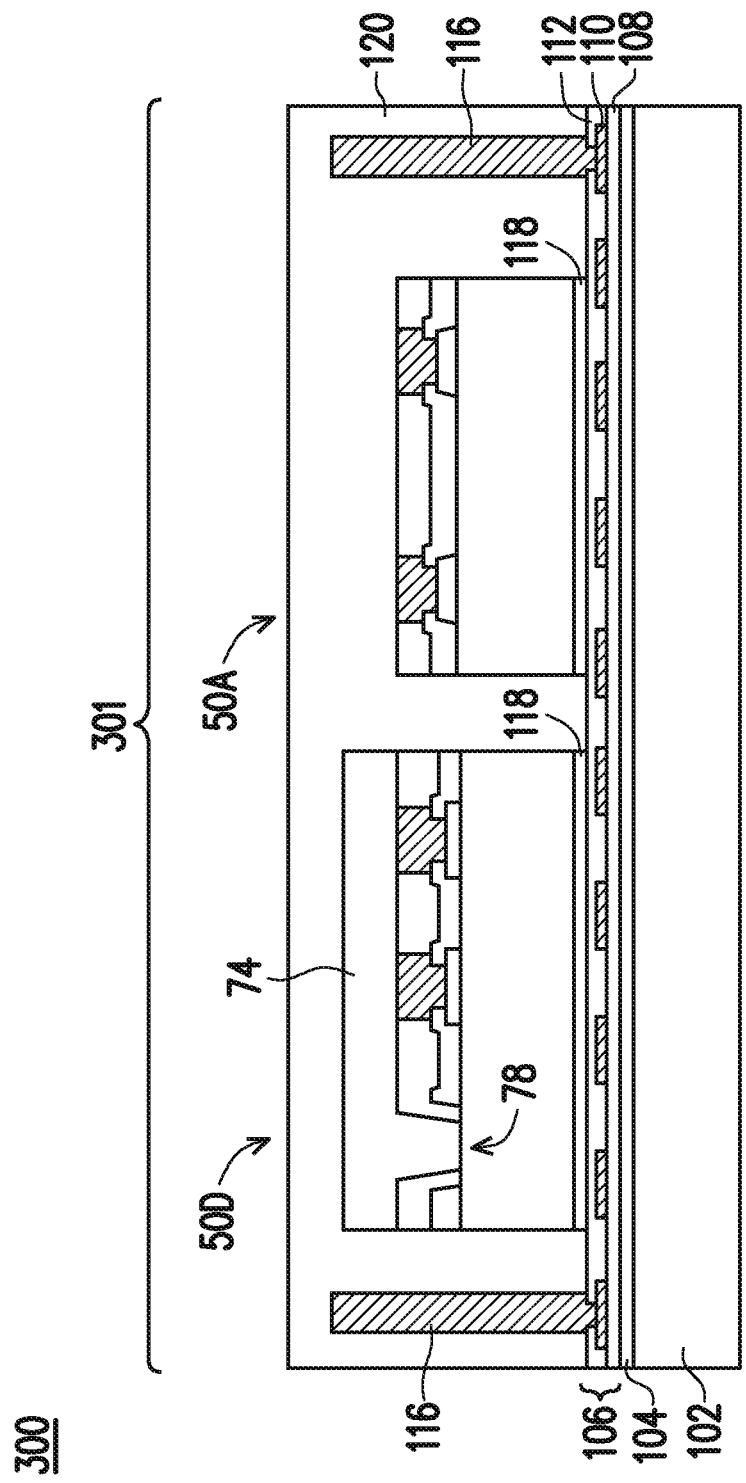

In FIG. 26, an encapsulant 120 is formed on and around the integrated circuit dies 50A and 50D, and the through vias 116. The encapsulant 120 may be formed over the carrier substrate 102 such that the integrated circuit dies 50A and 50D, and the through vias 116 are buried or covered. The encapsulant 120 is further formed in gap regions between the integrated circuit dies 50A and 50D and in gap regions between each of the through vias 116 and a respective one of the integrated circuit dies 50A and 50D. In some embodiments, the encapsulant 120 may be formed as described above with reference to FIG. 6 and the description is not repeated herein.

Figure 27:
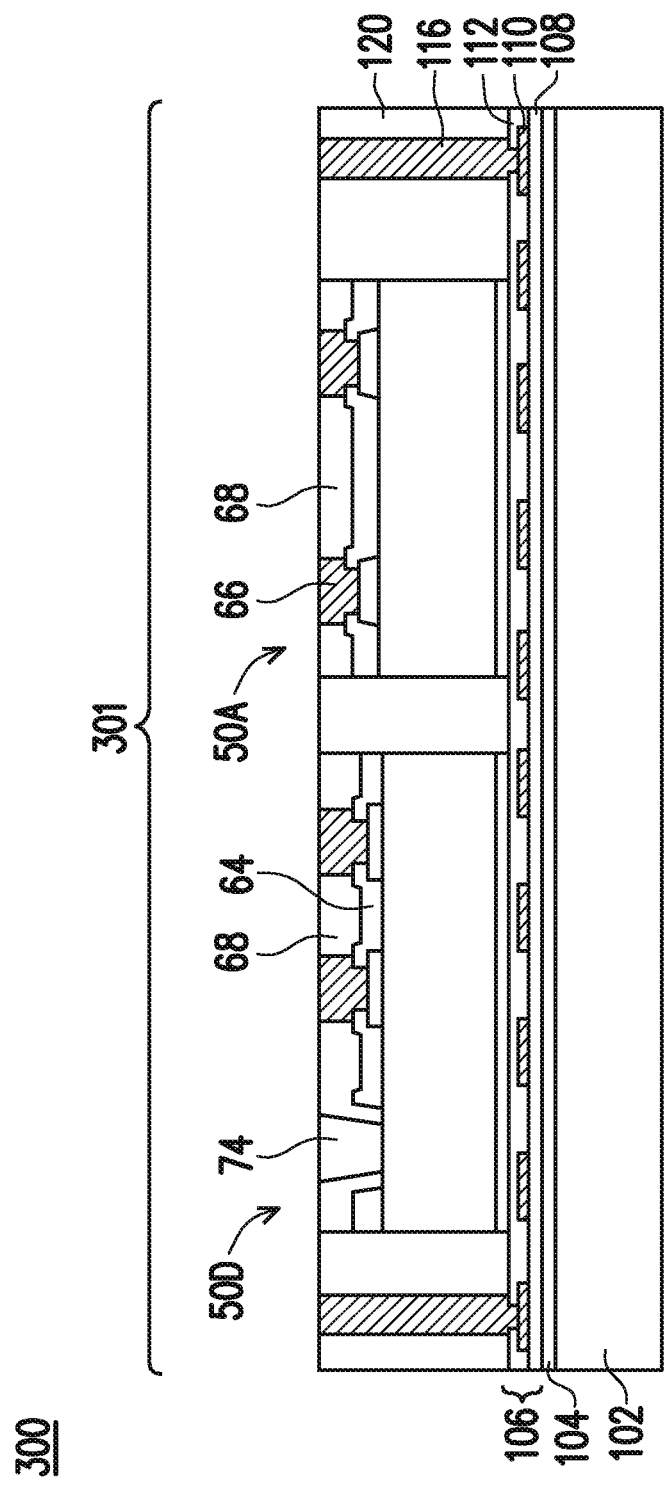

In FIG. 27, a planarization process is performed on the encapsulant 120 to expose the die connectors 66 and the through vias 116. The planarization process may also remove portions of the insulating layers 68, the sacrificial layer 74, the through vias 116, and/or the die connectors 66 until the die connectors 66 and the through vias 116 are exposed. Top surfaces of the die connectors 66, the through vias 116, the insulating layers 68, the sacrificial layer 74 and the encapsulant 120 are substantially coplanar after the planarization process within process variations. The planarization process may be, for example, a CMP, a grinding process, or the like. In some embodiments, the planarization may be omitted, for example, if the die connectors 66 and/or the through vias 116 are already exposed.

Figure 28:
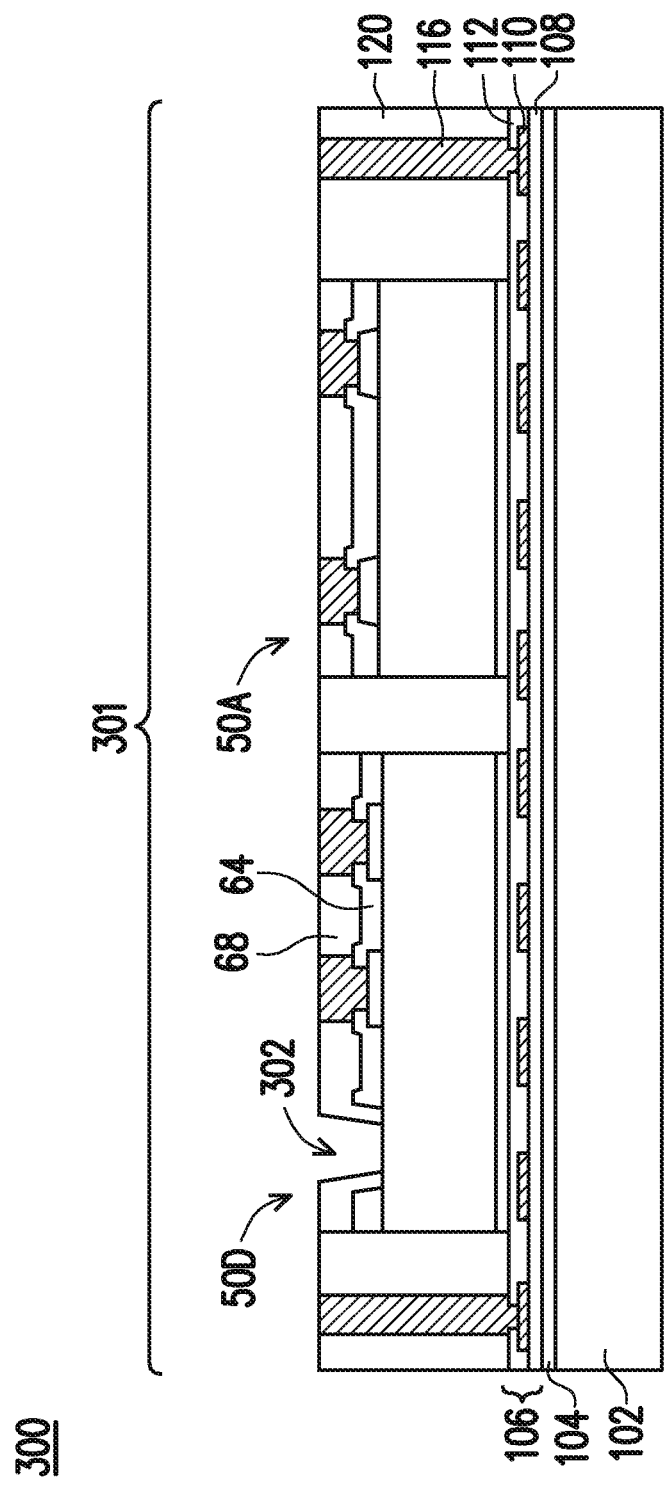

In FIG. 28, the sacrificial layer 74 is removed to form an opening 302. The opening 302 extends through the passivation layer 64 and the insulating layer 68 and exposes the grating coupler 78 of the integrated circuit die 50D. In some embodiments, the sacrificial layer 74 is removed as described above with reference to FIG. 8 and the description is not repeated herein.

Figure 29:
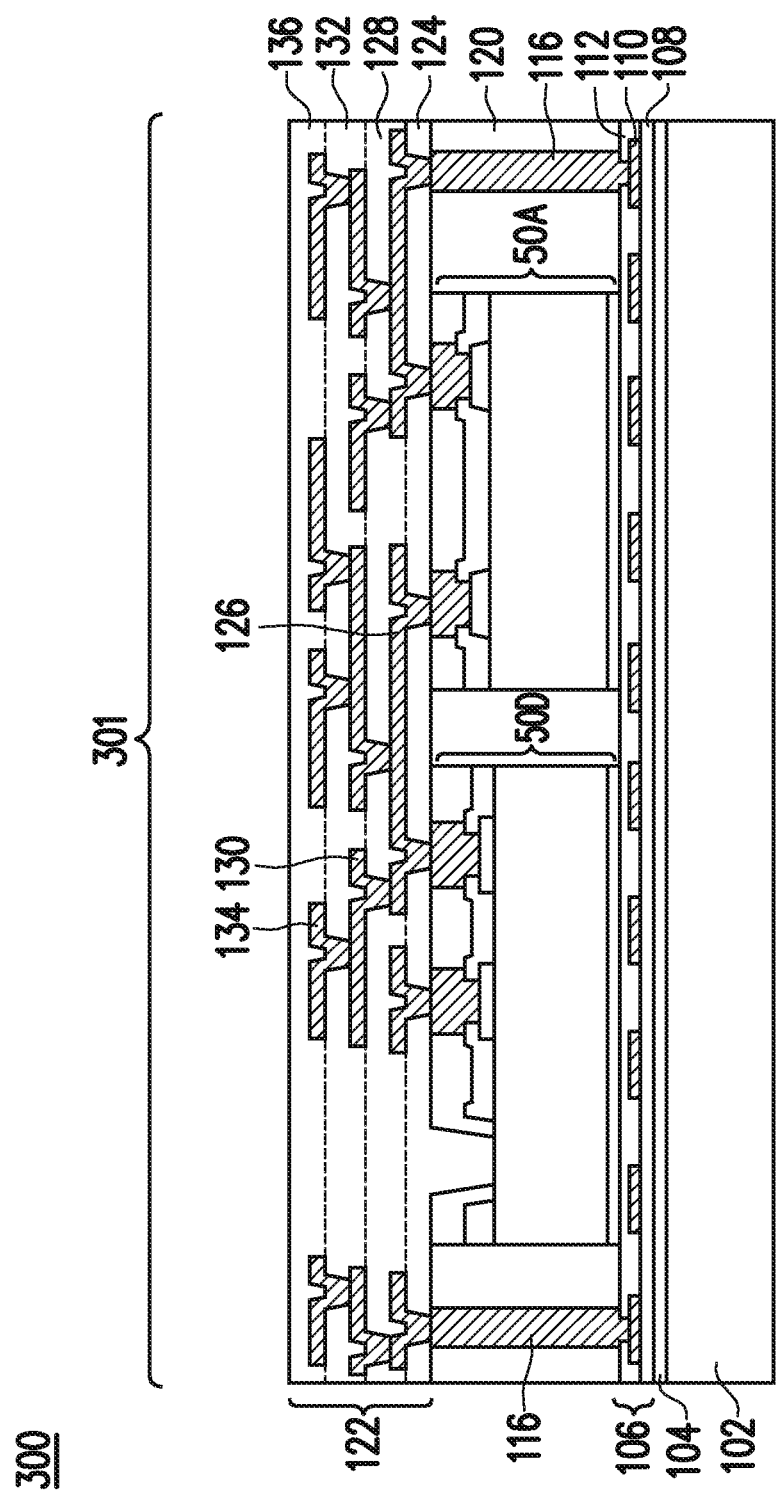

In FIG. 29, a redistribution structure 122 is formed over the encapsulant 120 and the integrated circuit dies 50A and 50D. In some embodiments, the redistribution structure 122 may be formed as described above with reference to FIG. 10 and the description is not repeated herein. In the illustrated embodiment, the insulating layer 124 of the redistribution structure 122 fills the opening 302 (see FIG. 28).

Figure 30:
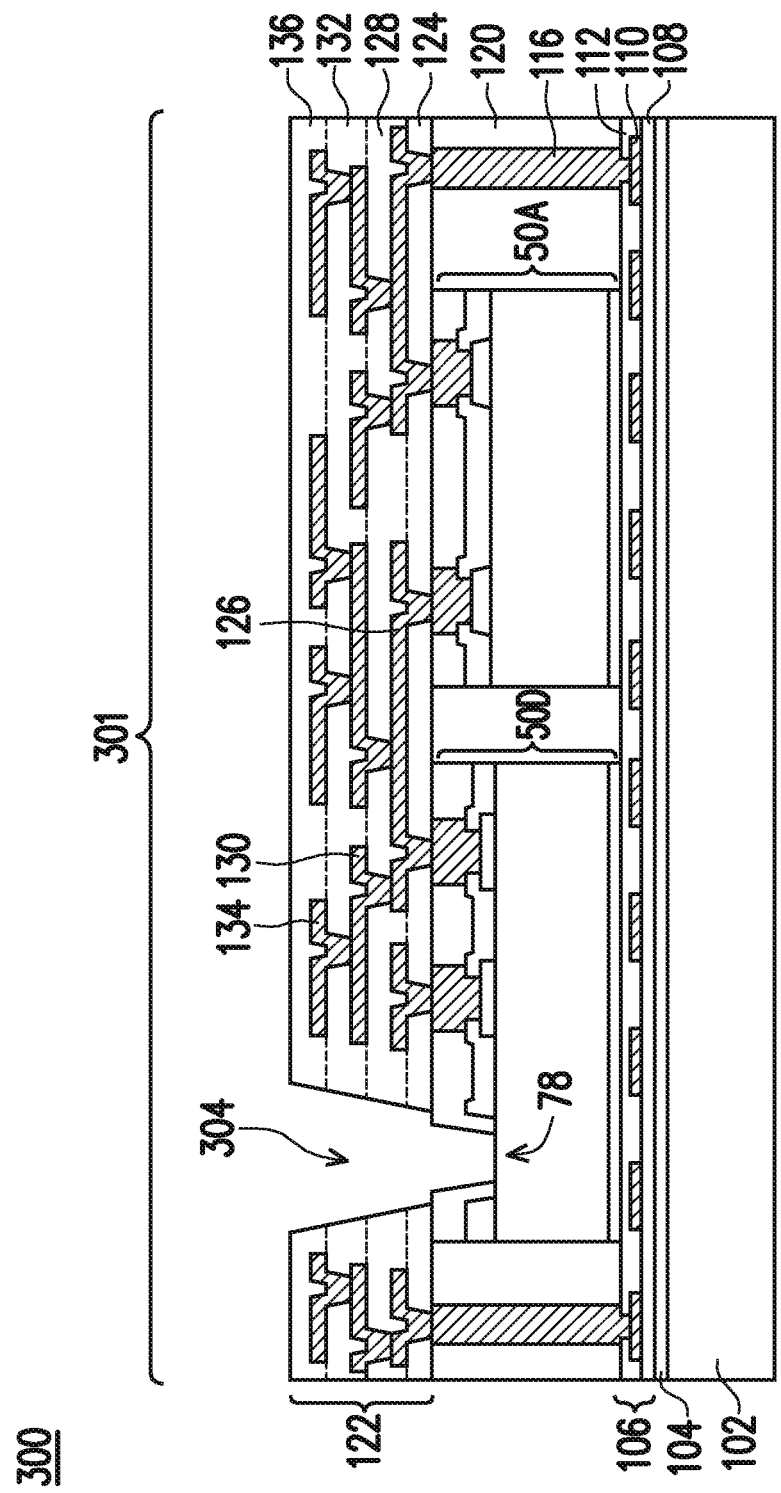

In FIG. 30, the redistribution structure 122 is patterned to form an opening 304. The pattering process may comprise suitable photolithography and etch methods. The suitable etch method may include one or more dry etch processes, one or more wet etch process, combinations thereof, or the like. The opening 304 extends though the insulating layers 124, 128, 132 and 136 of the redistribution structure 122, and through the passivation layer 64 and the insulating layer 68 of the integrated circuit die 50D. The opening 304 exposes the grating coupler 78 of the integrated circuit die 50D.

Further in FIG. 30, in the illustrated embodiment, the sacrificial layer 74 (see FIG. 27) is removed before forming the redistribution structure 122. In other embodiments, the sacrificial layer 74 may be removed after forming and patterning the redistribution structure 122.

Figure 31:
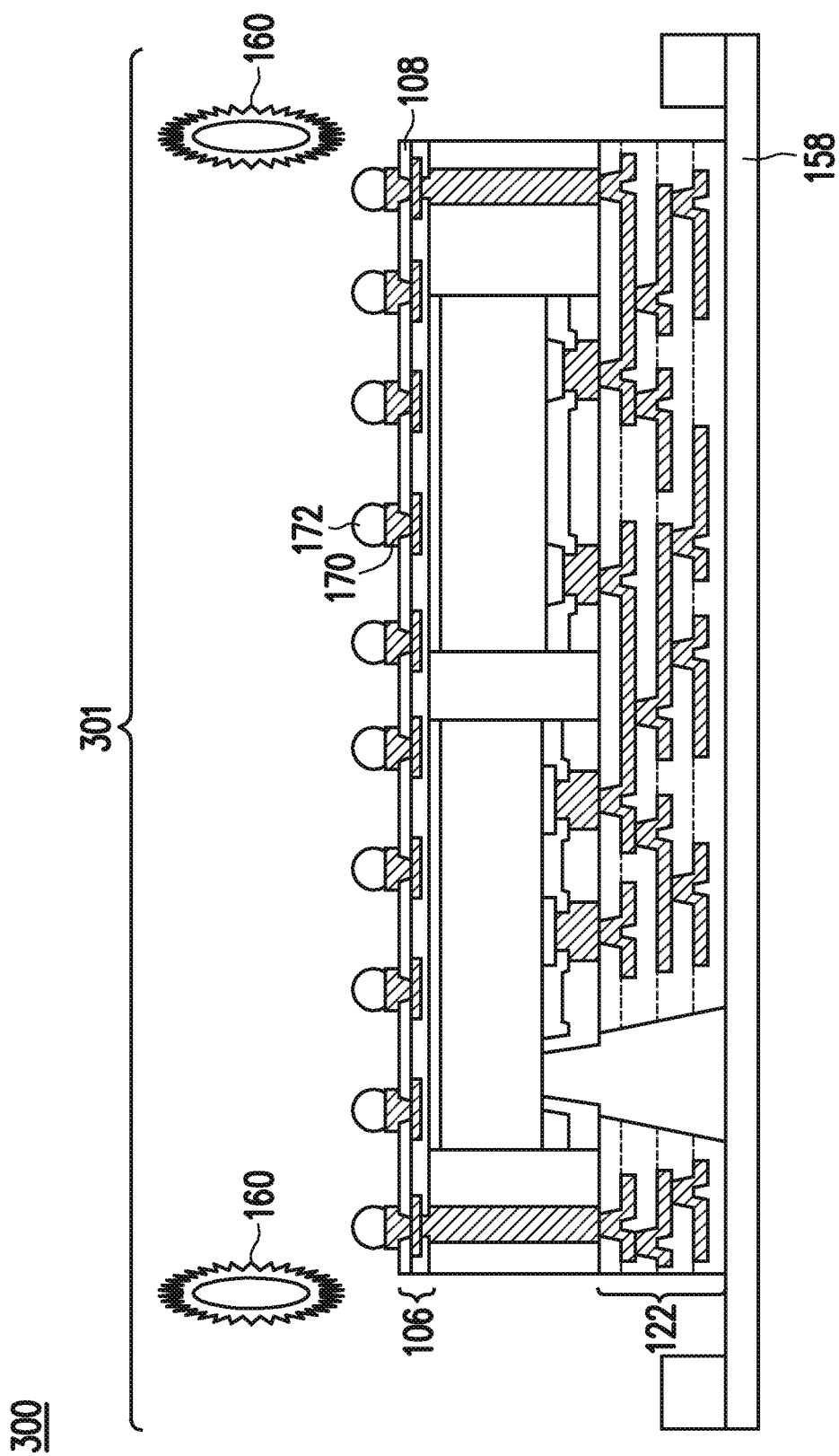

In FIG. 31, a carrier substrate de-bonding is performed to detach (or "de-bond") the carrier substrate 102 (see FIG. 30) from the package component 300. In some embodiments, the de-bonding may be performed as described above with reference to FIG. 11 and the description is not repeated herein. After de-bonding the carrier substrate 102, the package component 300 is flipped and is placed on a dicing tape 158. Subsequently, under-bump metallizations (UBMs) 170 and conductive connectors 172 are formed for external connection to the redistribution structure 106.

In some embodiments, openings are formed through the insulating layer 108 to expose portions of the metallization pattern 110. The openings may be formed, for example, using laser drilling, etching, or the like. The UBMs 170 are formed in the openings. In some embodiments, the UBMs 170 may be formed using similar materials and methods as the UBMs 138 described above with reference to FIG. 10 and the description is not repeated herein. After forming the UBMs 170, the conductive connectors 172 are formed on the UBMs 170. In some embodiments, the conductive connectors 172 may be formed using similar materials and methods as the conductive connectors 150 described above with reference to FIG. 10 and the description is not repeated herein.

Subsequently, a singulation process 160 is performed on the package component 300 by sawing along scribe line regions, e.g., between adjacent package regions of the package component 300. The sawing singulates the package region 301 from the rest of the package component 300 and forms a package 301.

Figure 32:
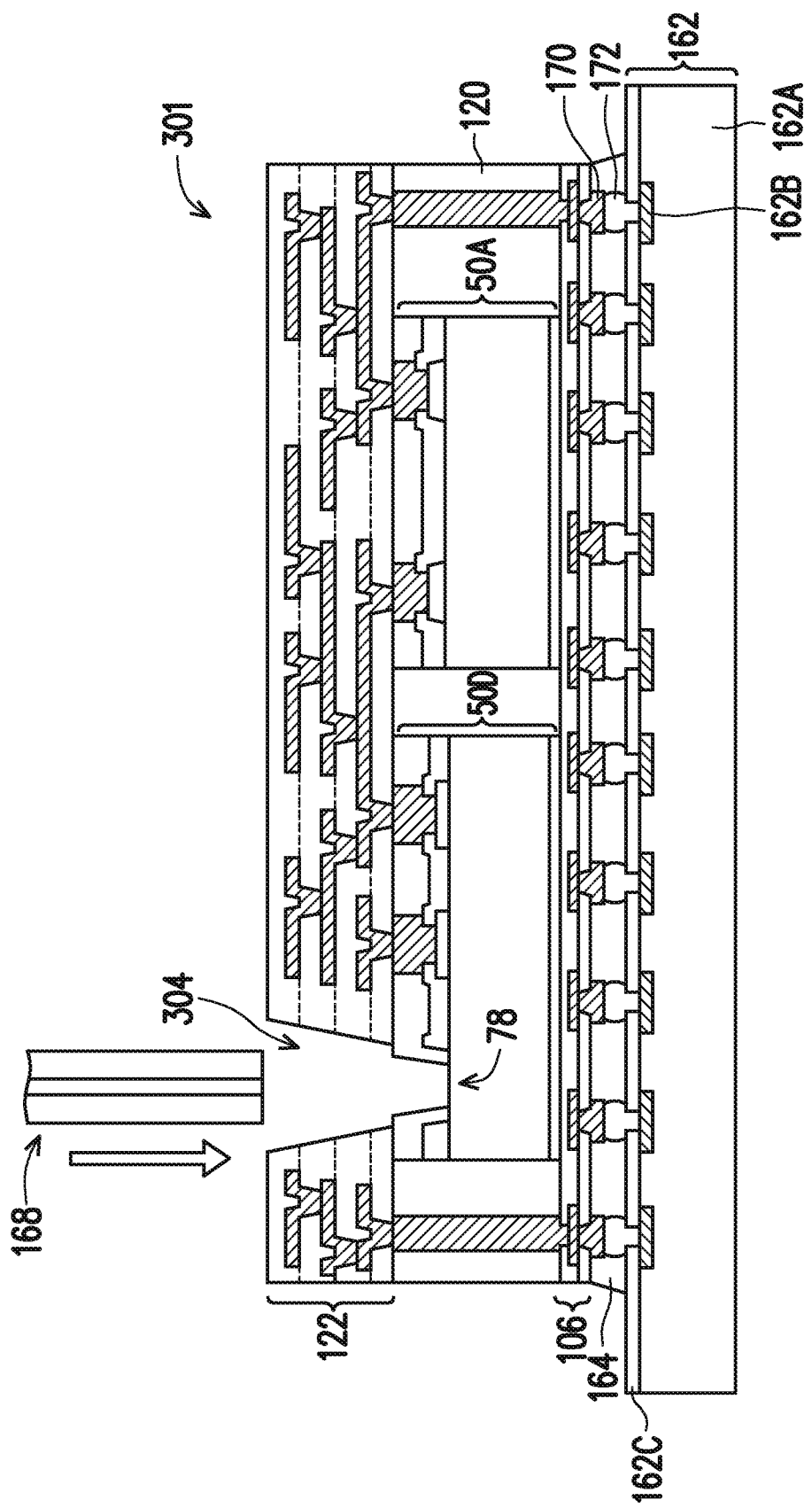

In FIG. 32, the package 301 is mounted to a package substrate 162 using the conductive connectors 172. In some embodiments, the package 301 is mounted to the package substrate 162 as described above with reference to FIG. 14 and the description is not repeated herein. In some embodiments, an underfill 164 may be formed between the package 301 and the package substrate 162 and surrounding the conductive connectors 172. The underfill 164 may be formed as described above with reference to FIG. 14 and the description is not repeated herein. In some embodiments, an optical fiber 168 is inserted into the opening 304 and is coupled to the grating coupler 78 of the integrated circuit die 50D.

In some embodiments, passive devices (e.g., surface mount devices (SMDs), not shown) may also be attached to the package 301 (e.g., to the UBMs 170) or to the package substrate 162 (e.g., to the bond pads 162B). For example, the passive devices may be bonded to a same surface of the package 301 or the package substrate 162 as the conductive connectors 172. The passive devices may be attached to the package 301 prior to mounting the package 301 on the package substrate 162, or may be attached to the package substrate 162 prior to or after mounting the package 301 on the package substrate 162.

Figure 33:
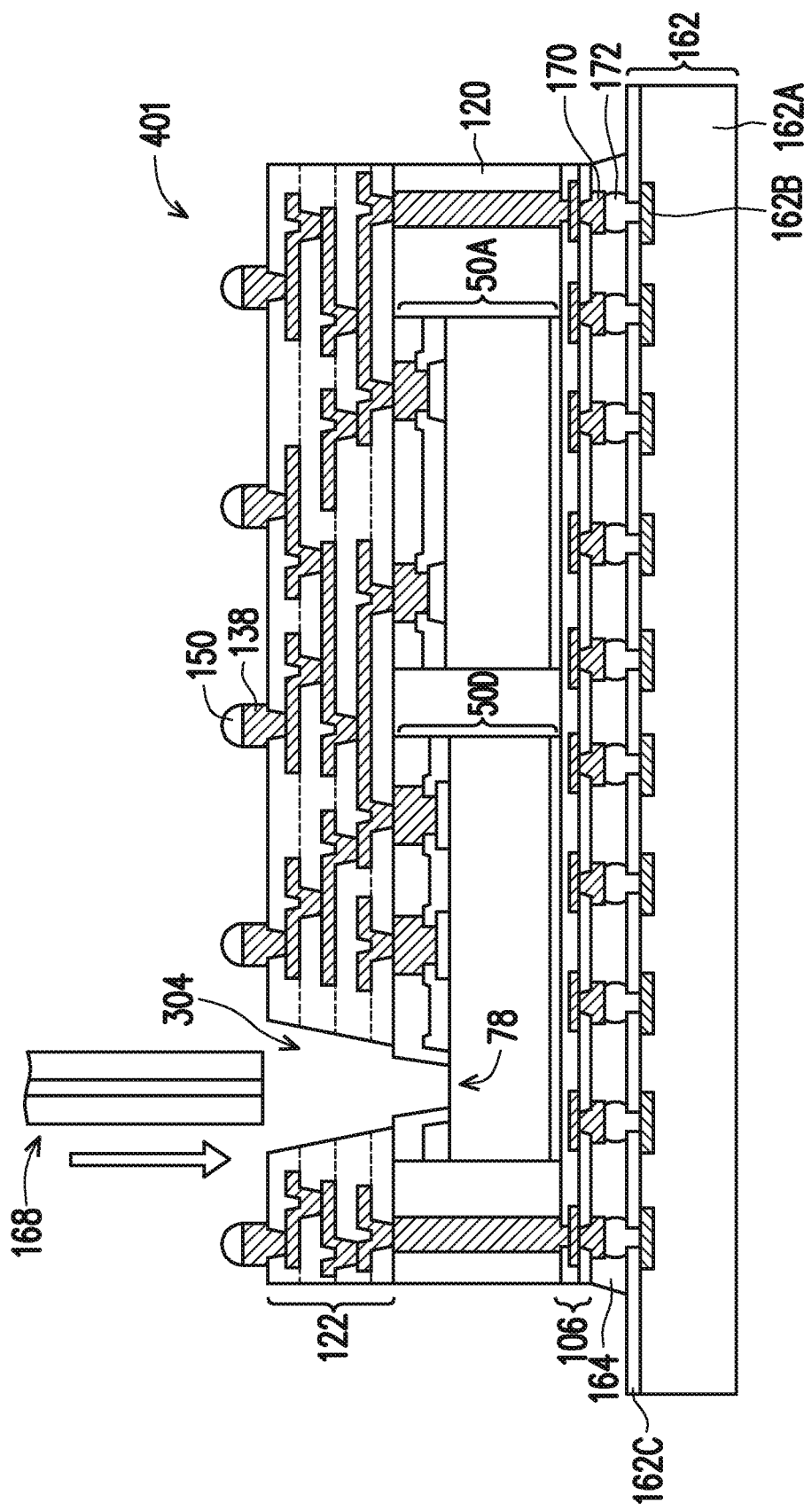
FIG. 33 illustrates a cross-sectional view a package in accordance with some embodiments.

FIG. 33 illustrates a cross-sectional view a package 401 in accordance with some embodiments. The package 401 is similar to the package 301 illustrated in FIG. 32, with similar features being labeled with similar numerical references, and the description of the similar features in not repeated herein. In some embodiments, the package 401 may be formed using process steps described above with reference to FIGS. 23-32 and the description is not repeated herein. In the illustrated embodiment, the UBMs 138 and the conductive connectors 150 are formed for external connection to the redistribution structure 122. The UBM 138 and the conductive connectors 150 may be formed as described above with reference to FIG. 10 and the description is not repeated herein. In some embodiments, the conductive connectors 150 are used to couple the package 401 to external components. The external components may be integrated circuit dies, packages, SMDs, package substrates, PCBs, interposers, or the like. In some embodiments, the external components are attached to conductive connectors 150, such that the opening 304 is not blocked. In such embodiments, the optical fiber 168 may not be blocked by the external components, may be inserted into the opening 304 and may be coupled to the grating coupler 78 of the integrated circuit die 50D.

FIGS. 34-43 illustrate cross-sectional views of intermediate steps during a process for forming a package in accordance with some embodiments. Some of features and process steps described with reference to FIGS. 34-43 are similar to the features and the process steps described above with reference to FIGS. 5-14 and 23-32, with similar features being labeled with similar numerical references, and descriptions of the similar features and the similar process steps are not repeated herein.

In FIGS. 34-43, a package region 501 of a package component 500 is illustrated. In some embodiments, the package component 500 comprises a plurality of package regions, and one or more of the integrated circuit dies are packaged to form an integrated circuit package in each of the package regions. The integrated circuit packages may also be referred to as InFO packages.

Figure 34:
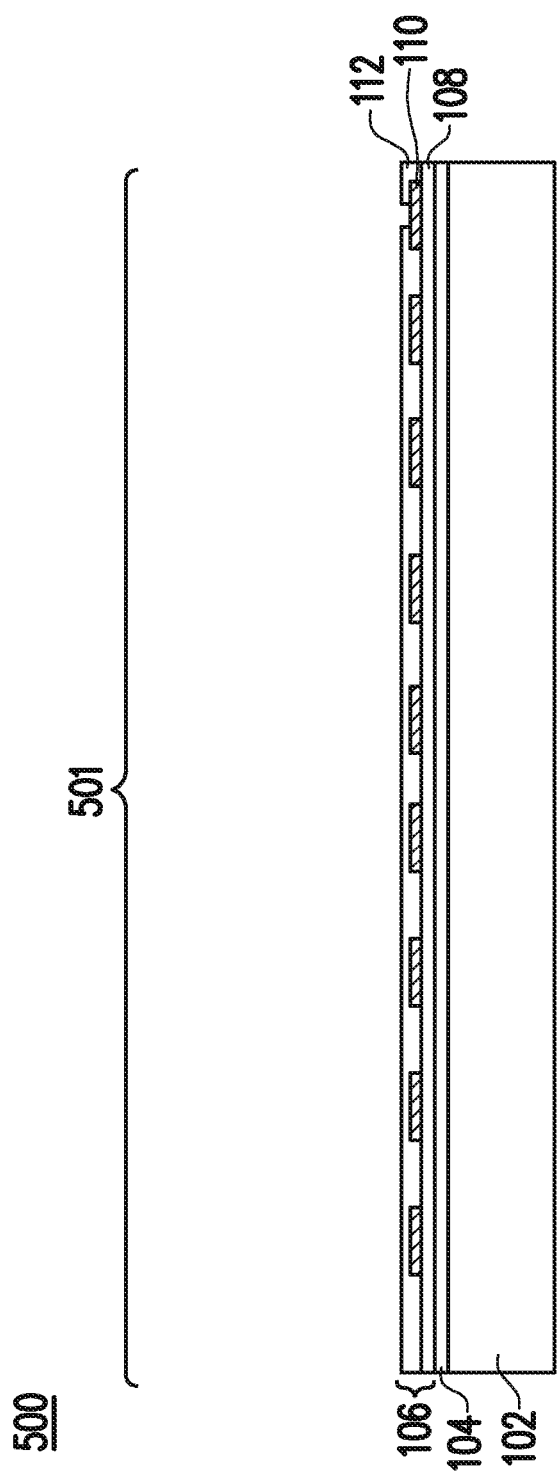
FIGS. 34-43 illustrate cross-sectional views of intermediate steps during a process for forming a package in accordance with some embodiments.

In FIG. 34, a carrier substrate 102 is provided, and a release layer 104 is formed on the carrier substrate 102. The carrier substrate 102 may be a wafer, such that multiple packages can be formed on the carrier substrate 102 simultaneously. In some embodiments, a redistribution structure 106 is formed on the release layer 104. The redistribution structure 106 may be formed as described above with reference to FIG. 23 and the description is not repeated herein. The insulating layer 112 is then patterned to form openings 114 exposing portions of the metallization pattern 110. The opening 114 may be formed as described above with reference to FIG. 23 and the description is not repeated herein.

Figure 35:
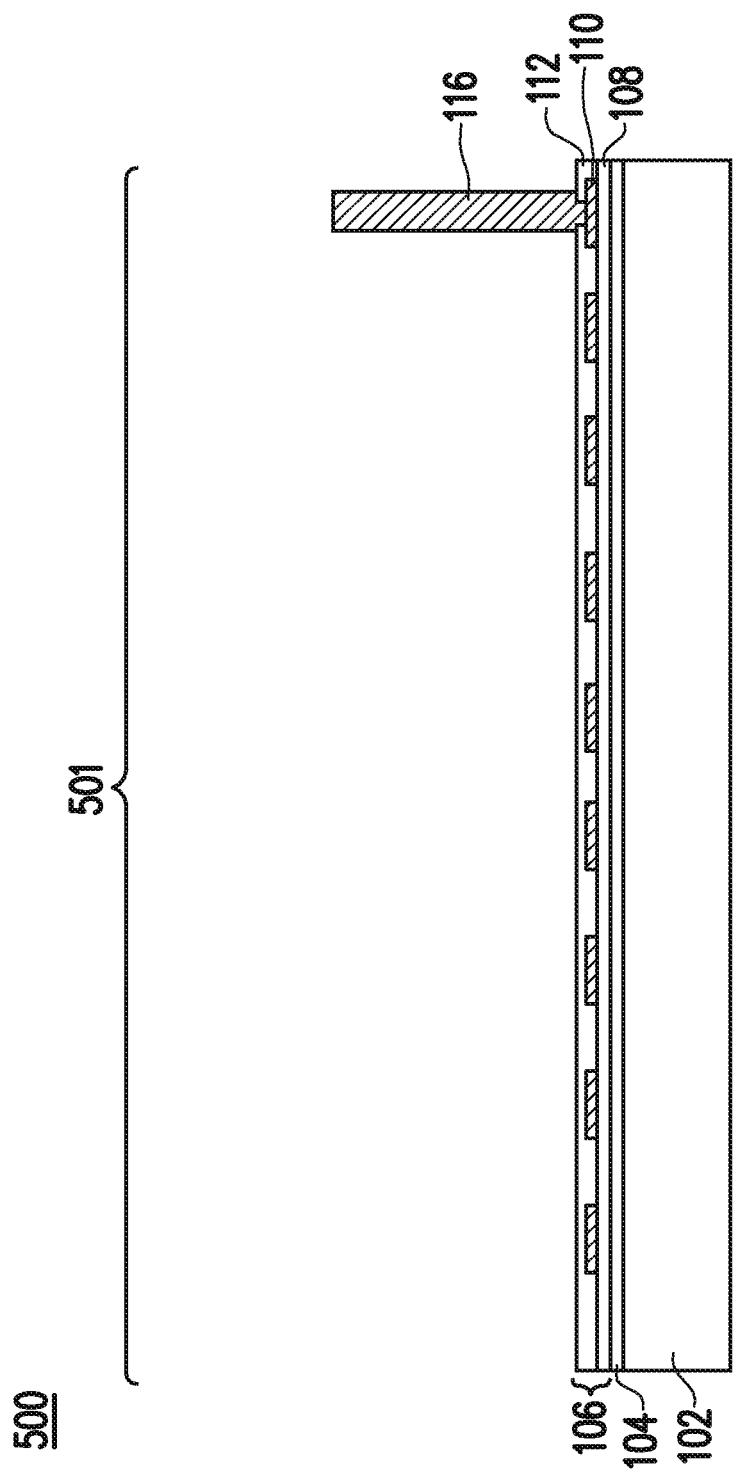

In FIG. 35, through vias 116 are formed in the openings 114 (see FIG. 34) and extending away from the topmost insulating layer of the redistribution structure 106 (e.g., the insulating layer 112). The through vias 116 may be formed as described with reference to FIG. 24 and the description is not repeated herein. In the illustrated embodiment, the through vias 116 are formed such that each of the through vias 116 is formed near an edge of a respective package region (e.g., the package region 501).

Figure 36:
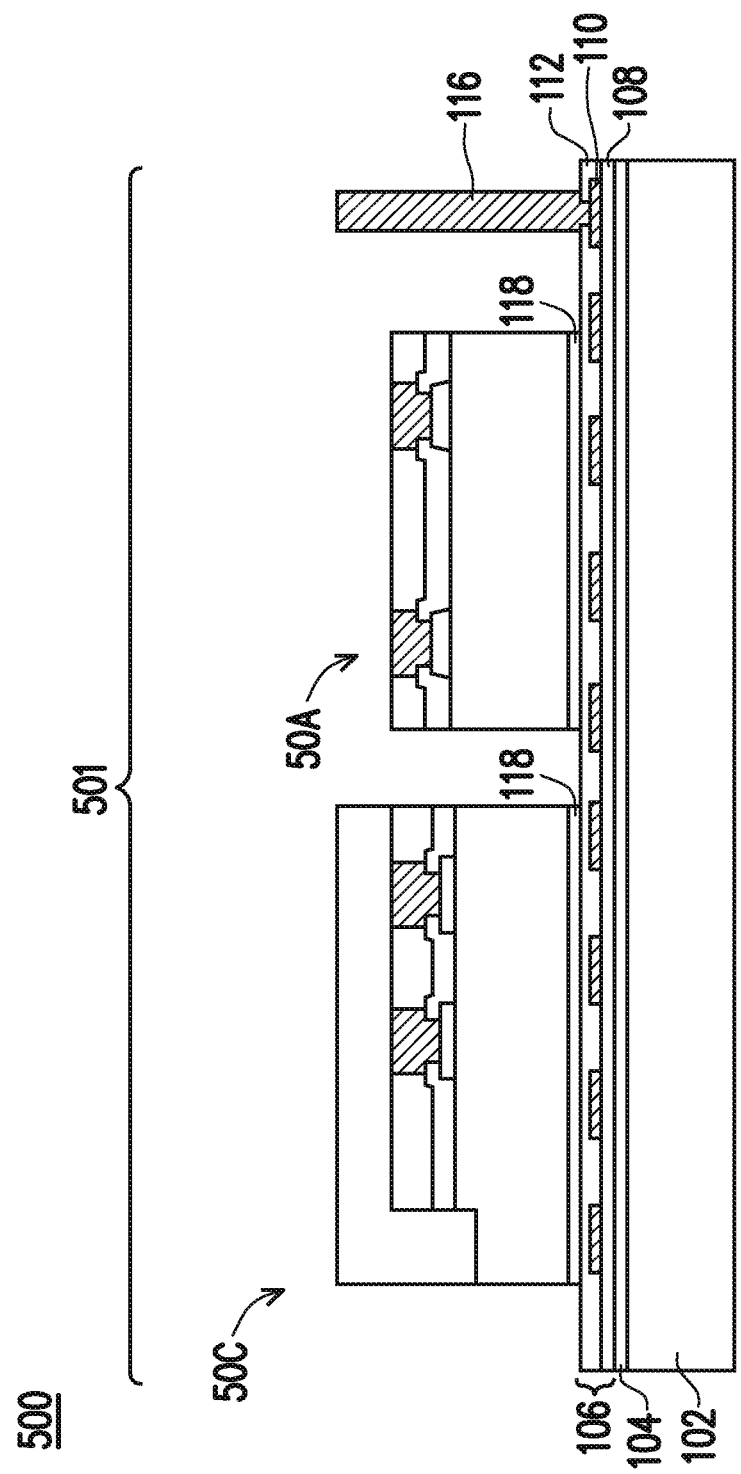

In FIG. 36, an integrated circuit die 50A (see FIG. 1) and an integrated circuit die 50C (see FIG. 3) are adhered to the insulating layer 112 by adhesive layers 118. The adhesive layers 118 are formed on back-sides of the integrated circuit dies 50A and 50C and adhere the integrated circuit dies 50A and 50C to the redistribution structure 106, such as to the insulating layer 112. The adhesive layers 118 may be applied to back-sides of the integrated circuit dies 50A and 50C, may be applied over the surface of the carrier substrate 102 if no redistribution structure 106 is utilized, or may be applied to an upper surface of the redistribution structure 106 if applicable. For example, the adhesive layers 118 may be applied to the back-sides of the integrated circuit die 50A and 50C before singulating to separate the integrated circuit dies 50A and 50C.

Figure 37:
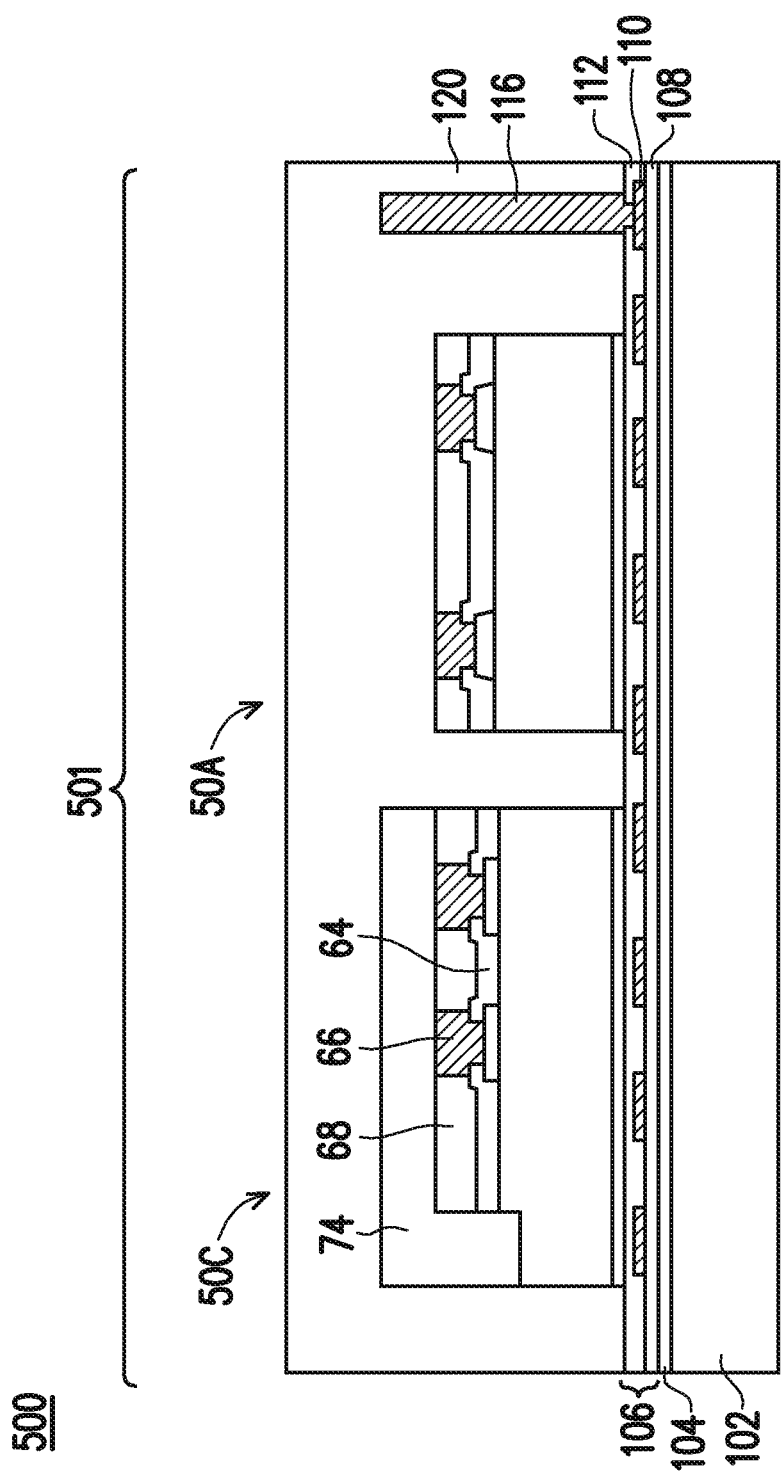

In FIG. 37, an encapsulant 120 is formed on and around the integrated circuit dies 50A and 50C, and the through vias 116. The encapsulant 120 may be formed over the carrier substrate 102 such that the integrated circuit dies 50A and 50C, and the through vias 116 are buried or covered. The encapsulant 120 is further formed in gap regions between the integrated circuit dies 50A and 50C and in gap regions between each of the through vias 116 and a respective one of the integrated circuit dies 50A and 50C. In some embodiments, the encapsulant 120 may be formed as described above with reference to FIG. 6 and the description is not repeated herein.

Figure 38:
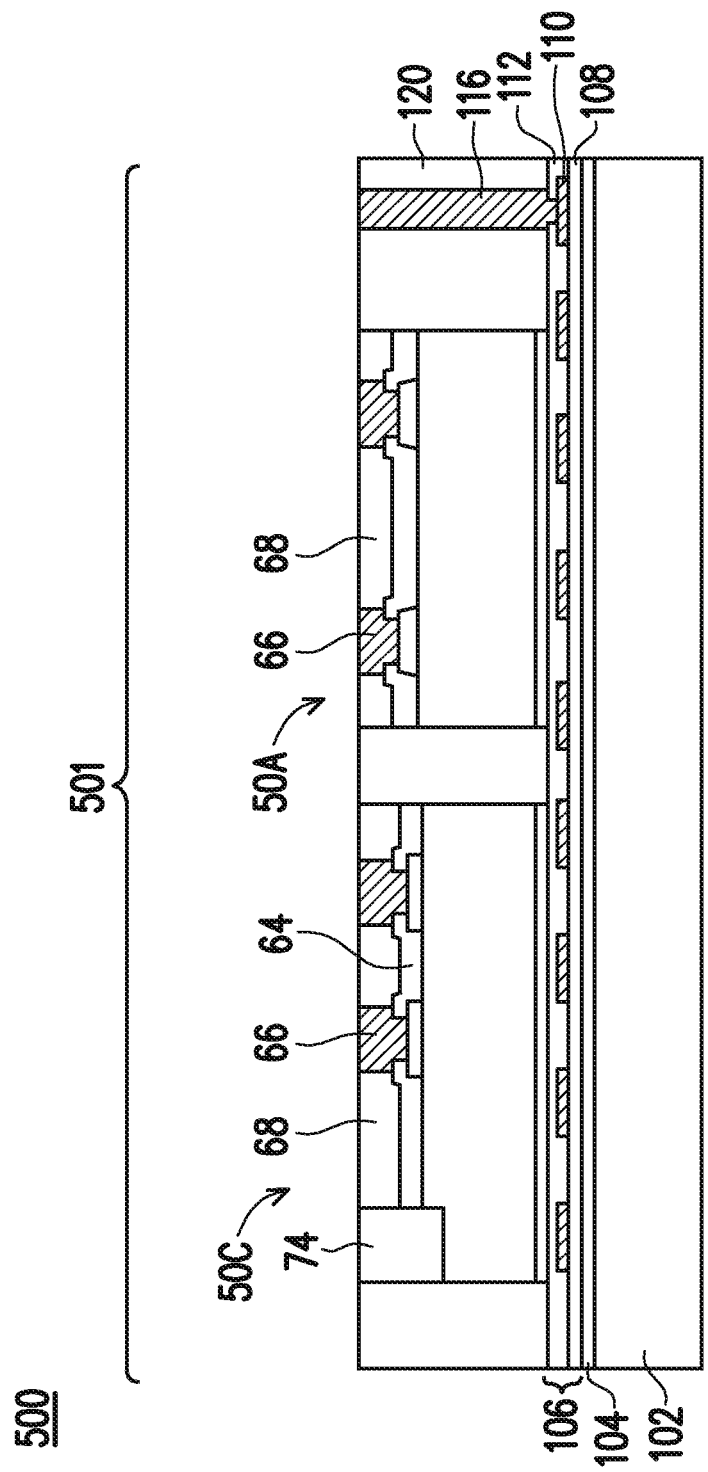

In FIG. 38, a planarization process is performed on the encapsulant 120 to expose the die connectors 66 and the through vias 116. The planarization process may also remove portions of the insulating layers 68, the sacrificial layer 74, the through vias 116, and/or the die connectors 66 until the die connectors 66 and the through vias 116 are exposed. Top surfaces of the die connectors 66, the through vias 116, the insulating layers 68, the sacrificial layer 74, and the encapsulant 120 are substantially coplanar after the planarization process within process variations. The planarization process may be, for example, a CMP, a grinding process, or the like. In some embodiments, the planarization may be omitted, for example, if the die connectors 66 and/or the through vias 116 are already exposed.

Figure 39:
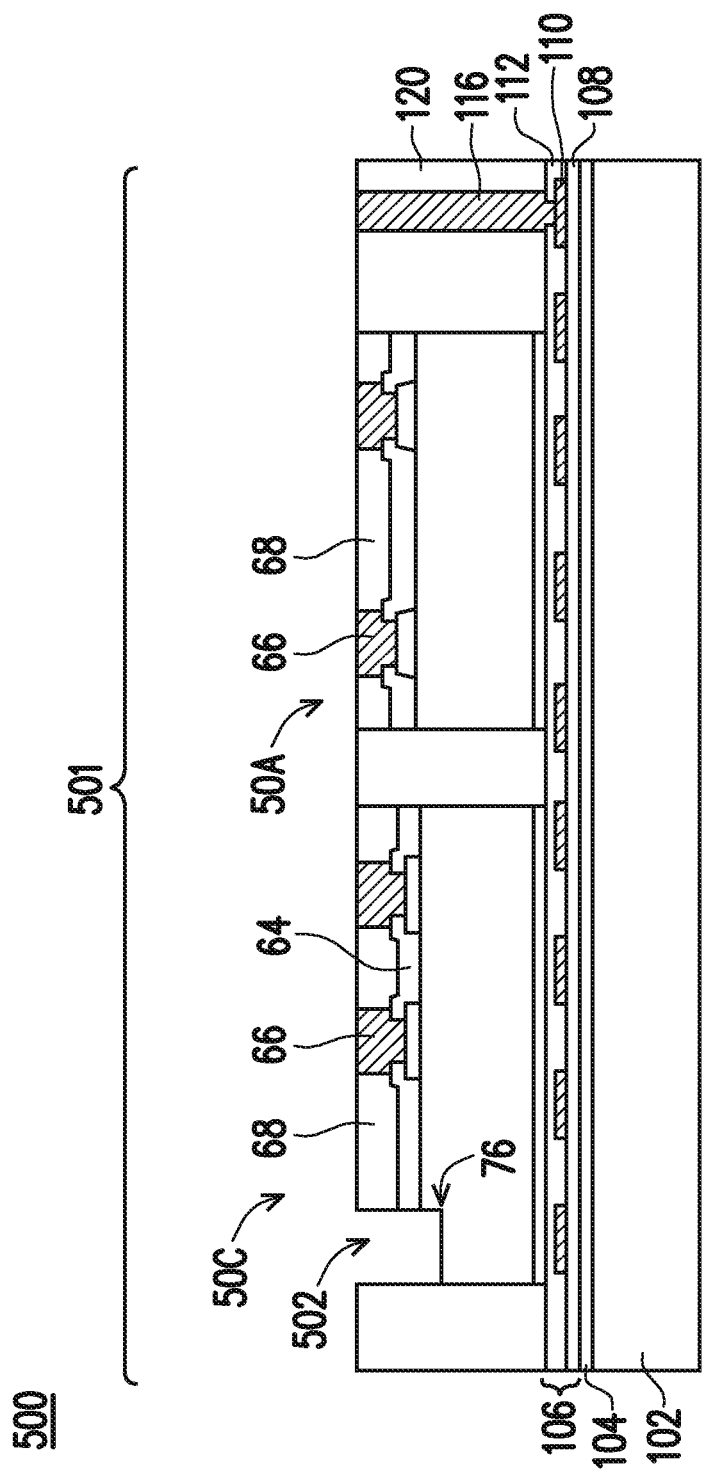

In FIG. 39, the sacrificial layer 74 is removed to form an opening 502. The opening 502 extends through the passivation layer 64 and the insulating layer 68 and exposes the edge coupler 76 of the integrated circuit die 50C. In some embodiments, the sacrificial layer 74 is removed as described above with reference to FIG. 8 and the description is not repeated herein.

Figure 40:
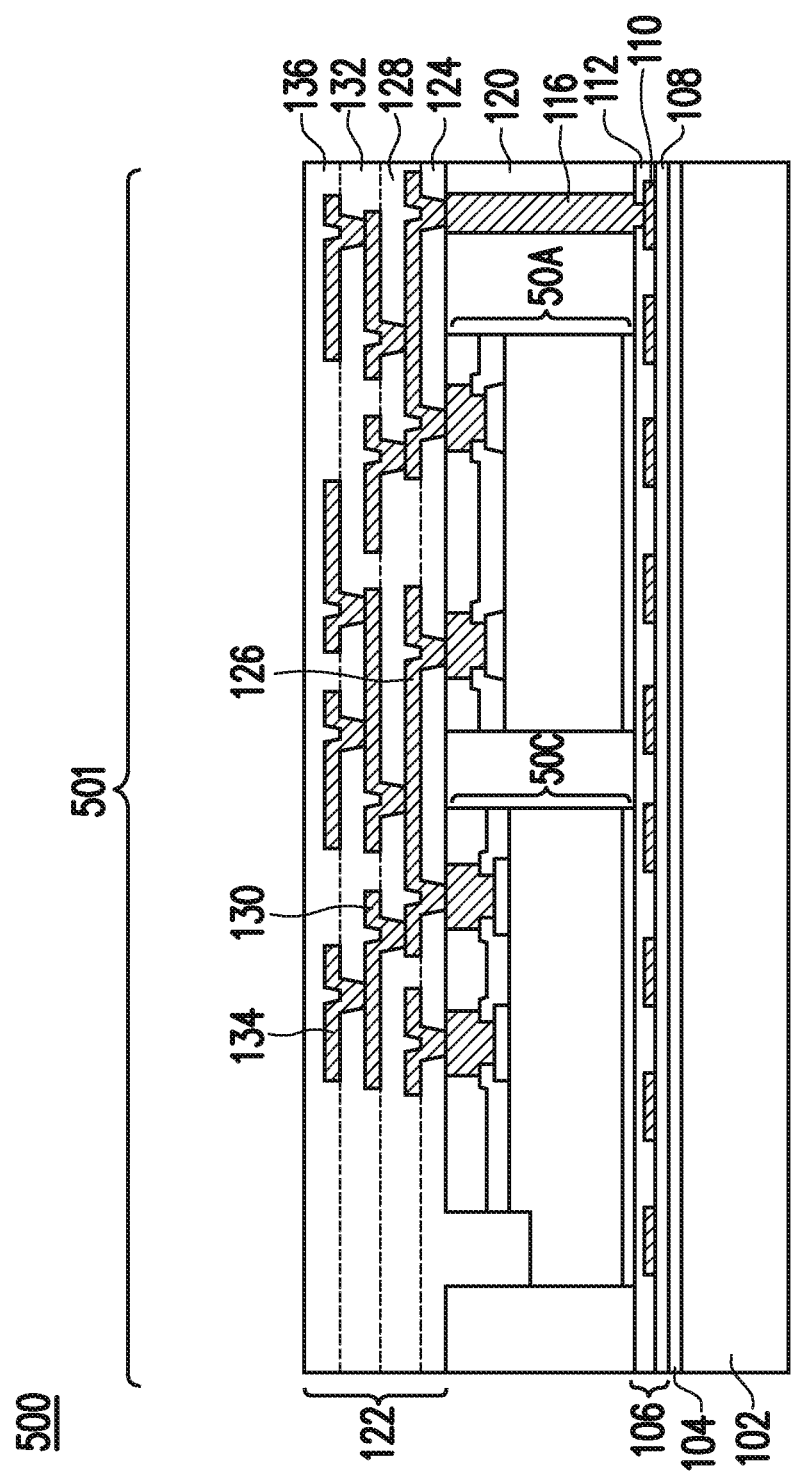

In FIG. 40, a redistribution structure 122 is formed over the encapsulant 120 and the integrated circuit dies 50A and 50C. In some embodiments, the redistribution structure 122 may be formed as described above with reference to FIG. 10 and the description is not repeated herein. In the illustrated embodiment, the insulating layer 124 of the redistribution structure 122 fills the opening 502 (see FIG. 39).

Figure 41:
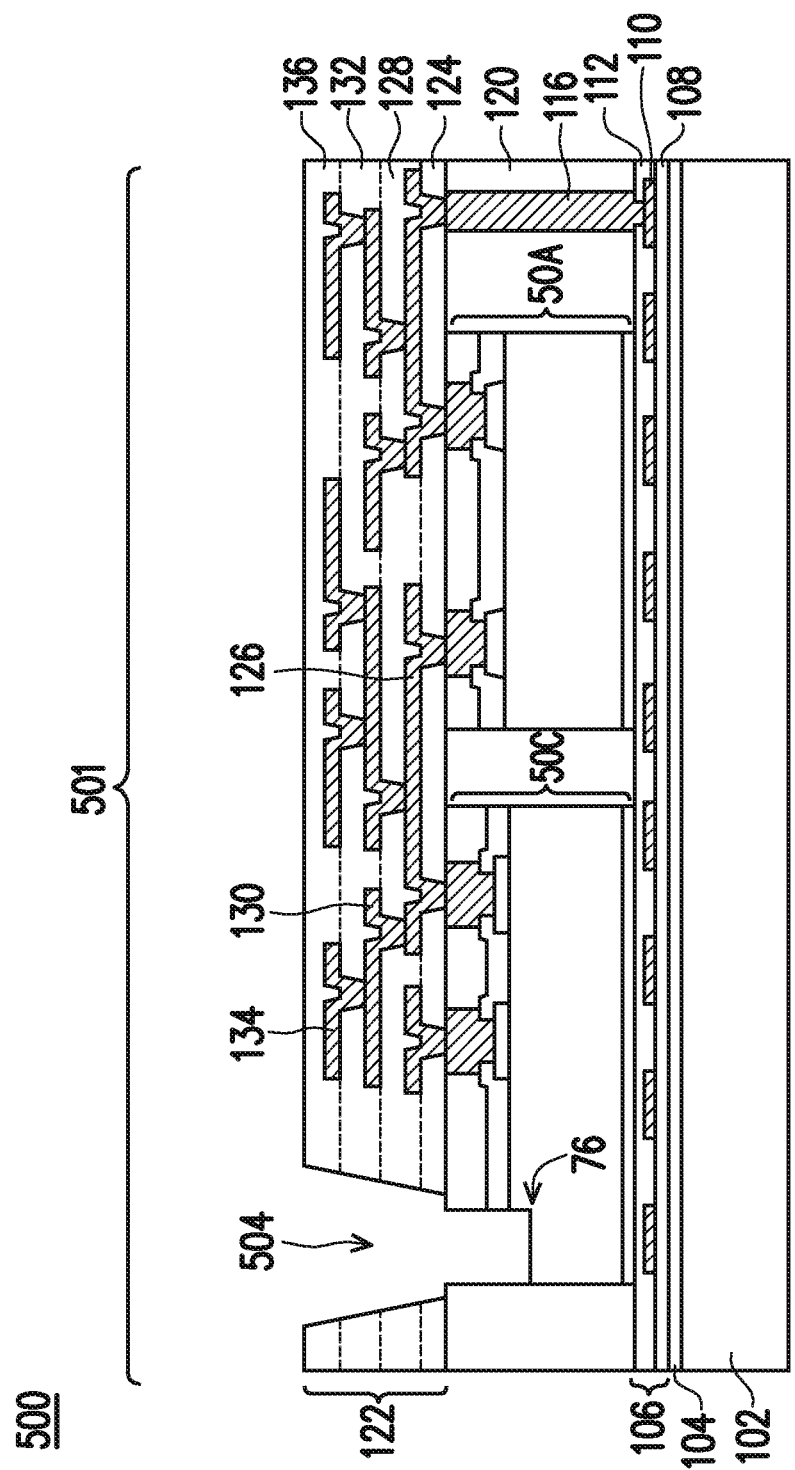

In FIG. 41, the redistribution structure 122 is patterned to form an opening 504. The pattering process may comprise suitable photolithography and etch methods. The suitable etch method may include one or more dry etch processes, one or more wet etch process, combinations thereof, or the like. The opening 504 extends though the insulating layers 124, 128, 132 and 136 of the redistribution structure 122, and through the passivation layer 64 and the insulating layer 68 of the integrated circuit die 50C. The opening 504 exposes the edge coupler 76 of the integrated circuit die 50C. In the illustrated embodiment, the sacrificial layer 74 (see FIG. 38) is removed before forming the redistribution structure 122. In other embodiments, the sacrificial layer 74 may be removed after forming and patterning the redistribution structure 122.

Figure 42:
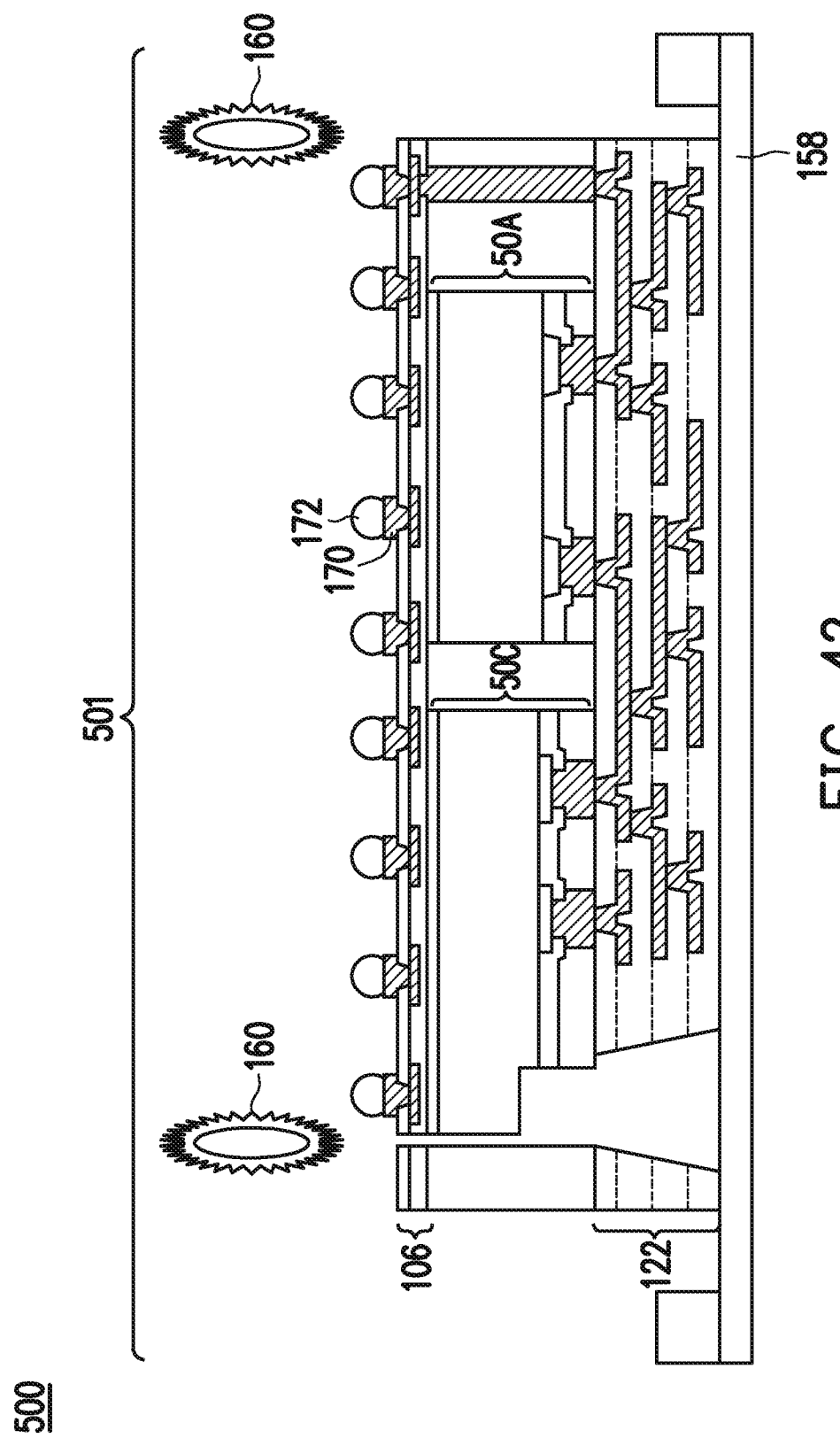

In FIG. 42, a carrier substrate de-bonding is performed to detach (or "de-bond") the carrier substrate 102 (see FIG. 41) from the package component 500. In some embodiments, the de-bonding may be performed as described above with reference to FIG. 11 and the description is not repeated herein. After de-bonding the carrier substrate 102, the package component 500 is flipped and is placed on a dicing tape 158. Subsequently, UBMs 170 and conductive connectors 172 are formed for external connection to the redistribution structure 106. The UBMs 170 and the conductive connectors 172 may be formed as described above with reference to FIG. 31 and the description is not repeated herein.

Subsequently, a singulation process 160 is performed on the package component 500 by sawing along scribe line regions, e.g., between adjacent package regions of the package component 500. The sawing singulates the package region 501 from the rest of the package component 500 and forms a package 501. In some embodiments, after the singulation process 160, a sidewall of the package 501 nearest to the edge coupler 76 is free of encapsulant 120.

Figure 43:
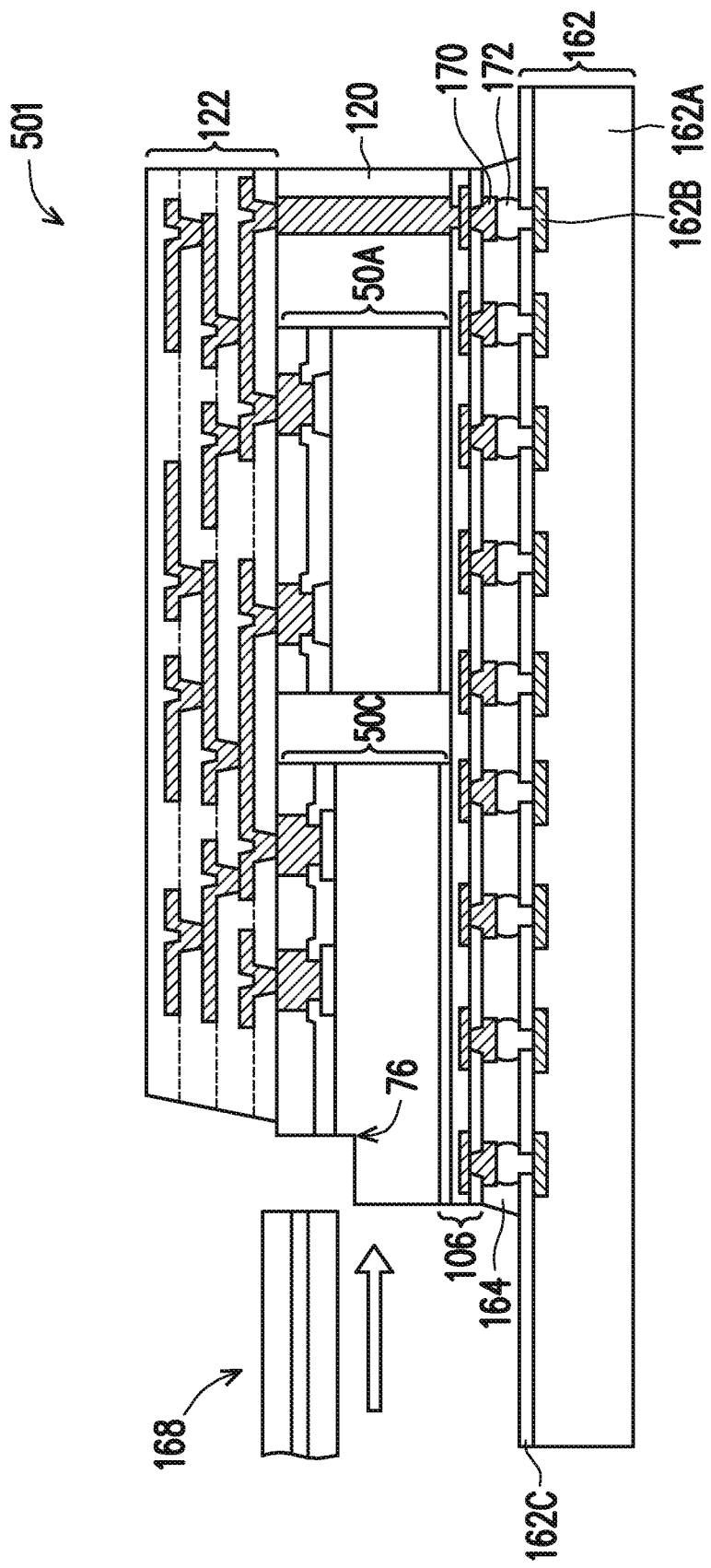

In FIG. 43, the package 501 is mounted to a package substrate 162 using the conductive connectors 172. In some embodiments, the package 501 is mounted to the package substrate 162 as described above with reference to FIG. 32 and the description is not repeated herein. In some embodiments, an underfill 164 may be formed between the package 501 and the package substrate 162 and surrounding the conductive connectors 172. The underfill 164 may be formed as described above in FIG. 14 and the description is not repeated herein.

In some embodiments, an optical fiber 168 is coupled to the edge coupler 76 of the integrated circuit die 50C. By performing the singulation process such that the sidewall of the package 501 nearest to the edge coupler 76 is free of the encapsulant 120, the coupling of the optical fiber 168 to the edge coupler 76 of the integrated circuit die 50C is not prevented.

In some embodiments, passive devices (e.g., surface mount devices (SMDs), not shown) may also be attached to the package 501 (e.g., to the UBMs 170) or to the package substrate 162 (e.g., to the bond pads 162B). For example, the passive devices may be bonded to a same surface of the package 501 or the package substrate 162 as the conductive connectors 172. The passive devices may be attached to the package 501 prior to mounting the package 501 on the package substrate 162, or may be attached to the package substrate 162 prior to or after mounting the package 501 on the package substrate 162.

Figure 44:
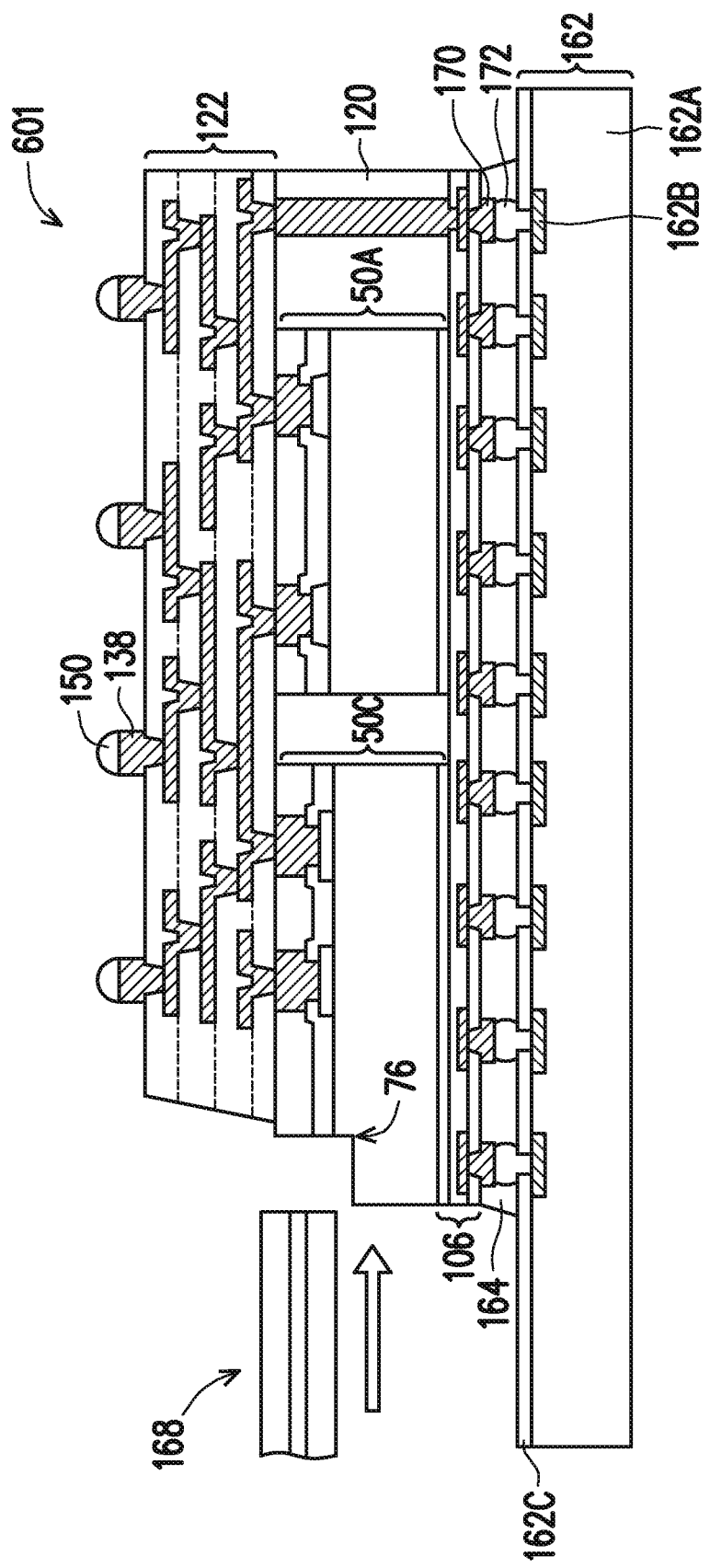
FIG. 44 illustrates a cross-sectional view a package in accordance with some embodiments.

FIG. 44 illustrates a cross-sectional view a package 601 in accordance with some embodiments. The package 601 is similar to the package 501 illustrated in FIG. 43, with similar features being labeled with similar numerical references, and the description of the similar features in not repeated herein. In some embodiments, the package 601 is formed using process steps described above with reference to FIGS. 34-43 and the description is not repeated herein. In the illustrated embodiment, the UBMs 138 and the conductive connectors 150 are formed for external connection to the redistribution structure 122. The UBMs 138 and the conductive connectors 150 may be formed as described above with reference to FIG. 10 and the description is not repeated herein. In some embodiments, the conductive connectors 150 are used to couple the package 601 to external components. The external components may be integrated circuit dies, packages, SMDs, package substrates, PCBs, interposers, or the like.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with an embodiment, an integrated circuit package includes: a photonic integrated circuit die, the photonic integrated circuit die includes an optical coupler; an encapsulant encapsulating the photonic integrated circuit die; a first redistribution structure over the photonic integrated circuit die and the encapsulant; and an opening exposing the optical coupler and a sidewall of the first redistribution structure. In an embodiment, the optical coupler is an edge coupler. In an embodiment, the opening extends through the first redistribution structure and the optical coupler is a grating coupler. In an embodiment, the integrated circuit package further includes an optical fiber coupled to the optical coupler. In an embodiment, the integrated circuit package further includes a second redistribution structure below the photonic integrated circuit die and the encapsulant. In an embodiment, the integrated circuit package further includes a through via within the encapsulant and electrically coupling the first redistribution structure to the second redistribution structure. In an embodiment, the integrated circuit package further includes a package substrate attached to the first redistribution structure.

In accordance with another embodiment, an integrated circuit package includes: an encapsulant having a first surface and a second surface opposite the first surface; a photonic integrated circuit die embedded in the encapsulant, the photonic integrated circuit die including an optical coupler, a first surface of the photonic integrated circuit die being level with the first surface of the encapsulant; a first redistribution structure on the first surface of the encapsulant; a second redistribution structure on the second surface of the encapsulant; and an opening exposing the optical coupler, a sidewall of the opening extending through the first redistribution structure. In an embodiment, the optical coupler is an edge coupler or a grating coupler. In an embodiment, a portion of the opening extends from the first surface of the photonic integrated circuit die toward a second surface of the photonic integrated circuit die, and the second surface of the photonic integrated circuit die is opposite the first surface of the photonic integrated circuit die. In an embodiment, a first sidewall of the photonic integrated circuit die proximate to the optical coupler is free from the encapsulant. In an embodiment, a second sidewall of the photonic integrated circuit die is in physical contact with the encapsulant, and the second sidewall of the photonic integrated circuit die is opposite the first sidewall of the photonic integrated circuit die. In an embodiment, the integrated circuit package further includes a through via within the encapsulant, the through via extending from the first surface of the encapsulant to the second surface of the encapsulant. In an embodiment, the integrated circuit package further includes an optical fiber extending into the opening and coupled to the optical coupler.

In accordance with yet another embodiment, a method includes: attaching a photonic integrated circuit die to a carrier substrate, the photonic integrated circuit die including an optical coupler; forming an encapsulant over the carrier substrate and the photonic integrated circuit die, the encapsulant extending along a sidewall of the photonic integrated circuit die; forming a first redistribution structure over the photonic integrated circuit die and the encapsulant; and patterning the first redistribution structure to form an opening in the first redistribution structure, the opening exposing the optical coupler. In an embodiment, the method further includes, before attaching the photonic integrated circuit die to the carrier substrate, forming a second redistribution structure over the carrier substrate. In an embodiment, the method further includes, before attaching the photonic integrated circuit die to the carrier substrate, forming a through via over the second redistribution structure. In an embodiment, the method further includes coupling an optical fiber to the optical coupler. In an embodiment, the optical coupler is an edge coupler. In an embodiment, the optical coupler is a grating coupler.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package comprising:
   a photonic integrated circuit die, the photonic integrated circuit die comprising an optical coupler and a die connector adjacent to the optical coupler;
   an encapsulant encapsulating the photonic integrated circuit die;
   a first redistribution structure over the photonic integrated circuit die and the encapsulant, the first redistribution structure comprising a metallization pattern in physical contact with the die connector; and
   an opening exposing the optical coupler and a sidewall of the first redistribution-structure, wherein the opening extends into the photonic integrated circuit die.

2. The integrated circuit package of claim 1, wherein the optical coupler is an edge coupler.

3. The integrated circuit package of claim 1, further comprising an optical fiber coupled to the optical coupler.

4. The integrated circuit package of claim 1, further comprising a second redistribution structure below the photonic integrated circuit die and the encapsulant.

5. The integrated circuit package of claim 4, further comprising a through via within the encapsulant and electrically coupling the first redistribution structure to the second redistribution structure.

6. The integrated circuit package of claim 1, further comprising a package substrate attached to the first redistribution structure.

7. An integrated circuit package comprising:
   an encapsulant having a first surface and a second surface opposite the first surface;
   a photonic integrated circuit die embedded in the encapsulant, the photonic integrated circuit die comprising an optical coupler, a first surface of the photonic integrated circuit die being level with the first surface of the encapsulant;
   a first redistribution structure on the first surface of the encapsulant, the first redistribution structure comprising a first metallization pattern;
   a second redistribution structure on the second surface of the encapsulant, the second redistribution structure comprising a second metallization pattern electrically coupled to the first metallization pattern; and
   an opening exposing the optical coupler, a sidewall of the opening extending through the first redistribution structure, wherein the opening extends into an interconnect structure of the photonic integrated circuit die.

8. The integrated circuit package of claim 7, wherein the optical coupler is an edge coupler.

9. The integrated circuit package of claim 7, wherein a portion of the opening extends from the first surface of the photonic integrated circuit die toward a second surface of the photonic integrated circuit die, and wherein the second surface of the photonic integrated circuit die is opposite the first surface of the photonic integrated circuit die.

10. The integrated circuit package of claim 7, wherein a first sidewall of the photonic integrated circuit die proximate to the optical coupler is free from the encapsulant.

11. The integrated circuit package of claim 10, wherein a second sidewall of the photonic integrated circuit die is in physical contact with the encapsulant, and wherein the second sidewall of the photonic integrated circuit die is opposite the first sidewall of the photonic integrated circuit die.

12. The integrated circuit package of claim 7, further comprising a through via within the encapsulant, the through via extending from the first surface of the encapsulant to the second surface of the encapsulant.

13. The integrated circuit package of claim 7, further comprising an optical fiber extending into the opening and coupled to the optical coupler.

14. An integrated circuit package comprising:
   a first redistribution structure comprising a first metallization pattern;
   a photonic integrated circuit die over the first redistribution structure, a backside of the photonic integrated circuit die being attached to the first redistribution structure, a front side of the photonic integrated circuit die comprising an optical coupler adjacent to a first sidewall of the photonic integrated circuit die;
   an encapsulant over the first redistribution structure, the encapsulant extending along and being in physical contact with a second sidewall of the photonic integrated circuit die, the first sidewall of the photonic integrated circuit die being free from the encapsulant, the second sidewall of the photonic integrated circuit die being opposite to the first sidewall of the photonic integrated circuit die;
   a second redistribution structure over and in electrical contact with the photonic integrated circuit die, the second redistribution structure comprising a second metallization pattern electrically coupled to the first metallization pattern; and
   an opening extending into photonic integrated circuit die and exposing the optical coupler.

15. The integrated circuit package of claim 14, wherein the optical coupler is an edge coupler.

16. The integrated circuit package of claim 14, wherein a sidewall of the second redistribution structure proximate to the first sidewall of the photonic integrated circuit die is a sloped sidewall.

17. The integrated circuit package of claim 14, wherein the backside of the photonic integrated circuit die is attached to the first redistribution structure using an adhesive layer.

18. The integrated circuit package of claim 14, wherein a bottom of the opening is below a top surface of the encapsulant.

19. The integrated circuit package of claim 14, further comprising an optical fiber coupled to the optical coupler.

20. The integrated circuit package of claim 1, wherein a top surface of the die connector is above a bottom of the opening.

* * * * *